US006468089B1

(12) United States Patent
Hubbard et al.

(10) Patent No.: US 6,468,089 B1
(45) Date of Patent: Oct. 22, 2002

(54) SOLDER-LESS PRINTED CIRCUIT BOARD EDGE CONNECTOR HAVING A COMMON GROUND CONTACT FOR A PLURALITY OF TRANSMISSION LINES

(75) Inventors: George M. Hubbard, Morgantown, IN (US); David Brearley, Jr., Naperville, IL (US)

(73) Assignee: Molex Incorporated, Lisle, IL (US)

(*) Notice: Subject to any disclaimer, the term of this patent is extended or adjusted under 35 U.S.C. 154(b) by 0 days.

(21) Appl. No.: 09/839,501

(22) Filed: Apr. 20, 2001

(51) Int. Cl.[7] .......................... H01R 12/00; H05K 1/00

(52) U.S. Cl. ......................... 439/63; 439/328; 439/579; 439/540.1

(58) Field of Search .......................... 439/63, 581, 328, 439/579, 540.1

(56) References Cited

U.S. PATENT DOCUMENTS

| | | | | |
|---|---|---|---|---|
| 3,184,650 A | * | 5/1965 | Ecker | 361/800 |
| 3,689,865 A | * | 9/1972 | Pierini et al. | 439/581 |
| 4,605,269 A | | 8/1986 | Cohen et al. | |
| 4,801,269 A | | 1/1989 | Howard et al. | 439/63 |
| 5,100,344 A | | 3/1992 | Truong | 439/578 |
| 5,123,863 A | | 6/1992 | Frederick et al. | 439/578 |
| 5,169,343 A | | 12/1992 | Andrews | 439/608 |
| 5,176,538 A | | 1/1993 | Hansell, III et al. | 439/607 |
| 5,190,474 A | | 3/1993 | Ginet | 439/582 |
| 5,334,050 A | | 8/1994 | Andrews | 439/579 |
| 5,478,258 A | | 12/1995 | Wang | 439/581 |
| 5,588,851 A | | 12/1996 | Morlion et al. | 439/108 |
| 5,613,880 A | | 3/1997 | Wang | 439/620 |
| 6,007,347 A | | 12/1999 | Keldsen et al. | 439/63 |
| 6,045,402 A | | 4/2000 | Embo et al. | 439/579 |
| 6,065,976 A | | 5/2000 | Wang | 439/63 |
| 6,149,461 A | | 11/2000 | Emery | 439/578 |

* cited by examiner

*Primary Examiner*—Neil Abrams
*Assistant Examiner*—Javaid Nasri
(74) *Attorney, Agent, or Firm*—A. A. Tirva

(57) ABSTRACT

A solder-less printed circuit board edge connector (10) translates construction and impedance characteristics associated with a coaxial cable (20) to construction and impedance characteristics associated with a micro-strip transmission line formed on a printed circuit board (22). The solder-less printed circuit board edge connector (10) comprises a first edge connector (16), a second edge connector (16), and a "C-shaped" ground contact (30). The first edge connector (16) receives a first coaxial cable (20) having a first signal potential and a first ground potential, and has a first slot formed therein having the first ground potential. The second edge connector (16) receives a second coaxial cable (20) having a second signal potential and a second ground potential. The second edge connector (16) has a second slot formed therein having the second ground potential. The "C-shaped" ground contact (30) is electrically and mechanically coupled to the first slot having the first ground potential and the second slot having the second ground potential. The "C-shaped" ground contact (30) has multiple "V-shaped" spring members (32) for contacting multiple ground contacts (28) on a printed circuit board (22, 24) when the printed circuit board (22, 24) is positioned in the first slot and the second slot. Multiple "C-shaped" ground contacts (30) may be electrically and mechanically coupled together using an extension member (52), integrally formed as a unitary unit with the multiple "C-shaped" ground contacts (30). The extension member (52) has a notch (54) formed therein to permit the extension member (52) to bypass a signal contact (38) carrying the second signal potential.

20 Claims, 11 Drawing Sheets

SOLDER-LESS PRINTED CIRCUIT BOARD EDGE CONNECTOR HAVING A COMMON GROUND CONTACT FOR A PLURALITY OF TRANSMISSION LINES

FIELD OF THE INVENTION

The present invention relates generally to solder-less printed circuit board edge connectors, and, more particularly, to a solder-less printed circuit board edge connector having a common ground contact for a plurality of transmission lines.

BACKGROUND OF THE INVENTION

A transmission line, formed as a coaxial cable or on a printed circuit board, has an unbalanced construction and an impedance characteristic of the transmission line, as is well known in the art. The unbalanced construction means that the electrical charge density per unit area on the outer conductor of the coaxial cable is less than the electrical charge density per unit area on the inner conductor of the coaxial cable. The impedance (Z) is defined as the square root of the result of inductance (L) of the transmission line divided by the capacitance (C) of the transmission line.

A connector that connects one transmission line to another transmission line needs to efficiently maintain the unbalanced construction and the impedance characteristics of the transmission line across the connector and at the interface of the connector to each transmission line. Inefficiency in the connector itself or at the interface of the connector to either transmission line causes an insertion loss or degradation of the construction and impedance characteristics of the transmission line resulting in a corresponding loss or degradation of the signal carried by the transmission line. Insertion loss may be due to reflection of the signal, resistance in the transmission line, inappropriate leakage of the signal, or inappropriate dielectric properties in the transmission line, as are all well known in the art. In turn, such an insertion loss or degradation of the signal carried by the transmission line reduces the operating performance of the system using the signal.

Two-piece coaxial cable connectors having a male connector piece connected to a coaxial cable and a female connector piece connected to a printed circuit board are well known in the art. Typically, the female connector piece is soldered to the printed circuit board near an edge of the printed circuit board. When several or many two-piece coaxial cable connectors are needed in a local area, a bridge connector, sometimes called a "go between" connector or a block connector, may be used to couple all of the coaxial cables to the multiple female connector pieces at the same time, as is well known in the art. Problems associated with the bridge connector include: misalignment between multiple male connector pieces mounted on the bridge connector and the multiple female connector pieces mounted on the printed circuit board, excessive insertion force required to mate the multiple male connector pieces mounted on the bridge connector and the multiple female connector pieces mounted on the printed circuit board, excessive cost and weight associated with the two-piece connector, decreased reliability and electrical performance associated with the two-piece connector, and potential replacement or rework problems associated with the multiple female connector pieces soldered to the printed circuit board.

Solder-less printed circuit board edge connectors are typically used for interconnecting printed circuit boards or for connecting a plurality of wires to a printed circuit board. Signal contacts and ground contacts on the printed circuit board electrically couple to signal contacts and ground contacts on the edge connector when the edge of the printed circuit board is inserted into the edge connector. Preferably, the edge connector is secured to a nearby case or a header mounted on the edge of the printed circuit board.

A coaxial cable connector employing a solder-less printed circuit board edge connector needs to translate the construction and impedance characteristics of a transmission line, formed as a coaxial cable, to a corresponding construction and impedance characteristics of a transmission line, formed on a planar printed circuit board.

Hence, a coaxial cable connector employing an edge connector needs to provide a coaxial-to-planar translation (or planar-to-coaxial translation) of the construction and impedance characteristics of a transmission line.

Generally, connectors also need to be designed to minimize parts count, decrease cost, increase reliability, increase the speed of the assembly of the connector, decrease cost, and the like. The following patents describe various types of connectors known in the art and a deficiency associated with each of the described connectors.

U.S. Pat. No. 4,605,269, issued Aug. 12, 1986 to AMP Inc., discloses a coaxial connector soldered to a printed circuit board for accepting multiple coaxial cables.

However, this patent does not disclose eliminating the coaxial connector.

U.S. Pat. No. 4,801, 269, issued Jan. 31, 1989 to The Regents of the University of California, discloses a coaxial cable connector for use with a printed circuit board edge connector to connect a single coaxial cable to a micro-strip line at the edge of a printed circuit board. However, this patent does not disclose: how to match an impedance between an edge connector and a micro-strip line, a ground contact integrally formed with a connector housing, a mechanism integrally formed with the connector for retaining the coaxial connector directly to a printed circuit board, a common ground contact electrically coupled to a ground potential of multiple transmission lines, or a signal contact having an spring finger integrally formed with a receptacle adapted to receive a center conductor of a coaxial cable, each for use with a solder-less printed circuit board edge connector.

U.S. Pat. No. 5,100,344, issued Mar. 31, 1992 to AMP Inc., discloses a BNC connector soldered to a printed circuit board, wherein the BNC connector is adapted to mate to a receiving connector attached to a coaxial cable. However, this patent does not disclose eliminating the BNC connector soldered to the printed circuit board.

U.S. Pat. No. 5,123,863, issued Jun. 23, 1992 to TRW Inc., discloses a solderless housing interconnect for a miniature semi-rigid coaxial cable, wherein the coaxial cable extends perpendicular to and through a hole in a printed circuit board to contact a ribbon cable coupled to a micro-strip. However, this patent does not disclose a connector for attaching a coaxial cable to an edge of a printed circuit board.

U.S. Pat. No. 5,169,343, issued Dec. 8, 1992 to E. I. Du Pont de Nemours and Company, discloses a connector soldered to a printed circuit board and adapted to receive multiple coaxial cables. However, this patent does not disclose eliminating the connector soldered to the printed circuit board.

U.S. Pat. No. 5,176,538, issued Jan. 5, 1993 to W. L. Gore and Associates, Inc., discloses a connector for multiple coaxial cables having a plurality of signal contacts and having a ground shield integrally formed with spring finger ground contacts, wherein the connector connects to a mating connector soldered to a printed circuit board. However, this patent does not disclose that the connector and spring fingers mate directly to a micro-strip at an edge of a printed circuit board.

U.S. Pat. No. 5,190,474, issued Mar. 2, 1993 to Radiall, Rosny-sous-Bois, France, discloses a first connector attached to a coaxial cable and a second connector soldered to a printed circuit board, wherein the first connector and the second connector are electrically and mechanically designed for coupling and decoupling. However, this patent does not disclose eliminating the second connector soldered to the printed circuit board.

U.S. Pat. No. 5,334,050, issued Aug. 2, 1994 to Derek Andrews, discloses a surface mounted connector soldered to a printed circuit board and adapted to receive multiple individual coaxial cables. However, this patent does not disclose eliminating the surface mounted connector soldered to the printed circuit board.

U.S. Pat. No. 5,478,258, issued Dec. 26, 1995 to Tsan-Chi Wang, discloses a BNC connector soldered to a printed circuit board, wherein the BNC connector is adapted to mate to a receiving connector attached to a coaxial cable. However, this patent does not disclose eliminating the BNC connector soldered to the printed circuit board.

U.S. Pat. No. 5,588,851, issued Dec. 31, 1996 to Framatome Connectors International, discloses a connector for connecting multiple coaxial cables with contact pins to a printed circuit board. The female ground contact members are formed out of and unitary with a ground plate. However, this patent does not disclose that the connector or the ground contact members attaches the coaxial cable to a micro-strip at an edge of the printed circuit board.

U.S. Pat. No. 5, 613,880, issued Mar. 25, 1997 to Tsan-Chi Wang, discloses a dual plug BNC connector soldered to a printed circuit board, wherein the BNC connector is adapted to mate to a receiving connector attached to a coaxial cable. However, this patent does not disclose eliminating the BNC connector soldered to the printed circuit board.

U.S. Pat. No. 6,007,347, issued Dec. 28, 1999 to Tektronix, Inc., discloses a BNC connector having a coaxial cable with insulation stripped back and disposed in a slot in a printed circuit board such that the stripped back inner conductor rests on and is soldered to a conductive pad on the printed circuit board. This patent also discloses selecting a distance between the sides of the conductive pad and the near edges of elongated holes in the printed circuit board to provide a predetermined transition impedance. However, this patent does not disclose eliminating the BNC connector mounted on the printed circuit board. Further, this patent does not disclose modifying the BNC connector to provide a predetermined impedance match.

U.S. Pat. No. 6,045,402, issued April 4, 2000 to Siemens, discloses a connector surface mounted with solder to a printed circuit board and adapted to receive multiple coaxial cables. FIG. 5 shows an integral lead/tubular lead-through, wherein the tube end accepts the inner conductor of the coaxial cable and the lead end is surface mounted with solder to the printed circuit board. However, this patent does not disclose eliminating the connector surface mounted with solder to the printed circuit board. Further, this patent does not disclose that an integral spring finger/tubular lead, wherein the spring finger provides a sliding connection to a micro-strip at an edge of a printed circuit board.

U.S. Pat. No. 6,065,976, issued May 23, 2000 to Tsan-Chi Wang, discloses a T-shaped BNC connector having slots for accepting and being soldered to a printed circuit board, wherein the BNC connector is adapted to mate to a receiving connector attached to a coaxial cable. However, this patent does not disclose eliminating the BNC connector soldered to the printed circuit board.

U.S. Pat. No. 6,149,461, issued Nov. 21, 2000 to ProComm, Inc., discloses a solder-less coaxial cable termination-mounting device, wherein a first portion of the device is soldered to a printed circuit board and other portions are assembled to retain the inner conductor, the outer conductor and the insulation of the coaxial cable. However, this patent does not disclose eliminating the first portion of the device that is soldered to the printed circuit board as well as the other portions of the assembly.

The foregoing patents do not teach or suggest, alone or in combination, a solder- less printed circuit board edge connector having a common ground contact for a plurality of transmission lines. Accordingly, there is a need for a solder-less printed circuit board edge connector having a common ground contact for a plurality of transmission lines to advantageously minimize parts count, increase reliability, minimize rework or replacement, decrease cost, decrease labor for the assembly of the connector, and the like.

DETAILED DESCRIPTION OF THE PREFERRED EMBODIMENTS

A. Overview of the Preferred Embodiments

Figure 1:
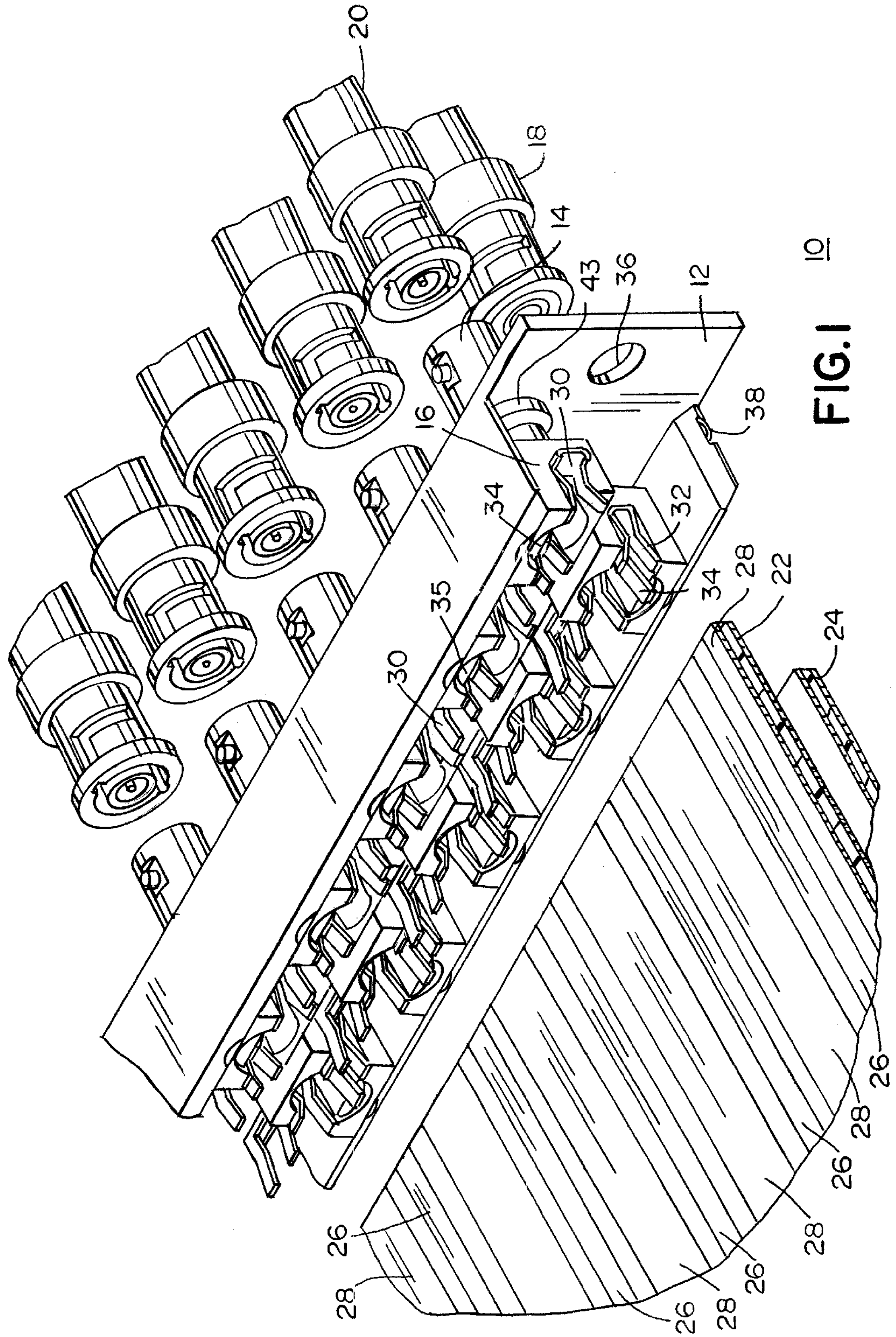
FIG. 1 illustrates a front, top and right side perspective view of a first coaxial cable connector including a solder-less printed circuit board edge connector for a plurality of coaxial cables, in accordance with a first preferred embodiment of the present invention.

1. General Overview Of The First, Second And Third Coaxial Cable Connectors

FIGS. 1 through 10 illustrate a first coaxial cable connector 10 in accordance with a first preferred embodiment of the present invention. In the first preferred embodiment of the present invention, the first coaxial cable connector 10 includes a solder-less printed circuit board (pcb) edge connector 16 for connecting a plurality of coaxial cables 20 to an edge of one or more printed circuit boards 22 and 24. Each one of the plurality of coaxial cables 20 is adapted to be connected to and removed from the first coaxial cable connector 10 using another coaxial connector 14 and 18, such as, for example, a bayonet- locking connector (BNC). FIGS. 11 through 28 illustrate a second coaxial cable connector 54 in accordance with a second preferred embodiment of the present invention. In the second preferred embodiment of the present invention, the second coaxial connector 54 includes a solder-less printed circuit board edge connector for connecting one coaxial cable 58 to an edge of a printed circuit board 60. The one coaxial cable 58 is adapted to be permanently connected to the edge connector. FIGS. 29 through 33 illustrate a third coaxial cable connector 112 in accordance with a third preferred embodiment of the present invention. In the third preferred embodiment of the present invention, the third coaxial cable connector 112 includes a solder-less printed circuit board edge connector 116 for connecting a plurality of coaxial cables 118 to an edge of one or more printed circuit boards 120. Each one of the plurality of coaxial cables 118 is adapted to be permanently connected to the edge connector.

Generally, each of the first, second and third coaxial cable connectors, as shown in FIGS. 1–10, FIGS. 11–28 and FIGS. 29–33, respectively, translate the construction and impedance characteristics of a transmission line, formed as a coaxial cable, to a corresponding construction and impedance characteristics of a transmission line, formed on a planar printed circuit board. Hence, each of the first, second and third coaxial connectors generally provides a coaxial-to-planar translation (or planar-to-coaxial translation) of the construction and impedance characteristics of a transmission line.

2. Particular Overview of Features of the First Second and Third Coaxial Cable Connectors The following table summarizes five particular features shown and described herein with reference to each of the first, second and third coaxial cable connectors. Each of five features provide a coaxial-to-planar translation (or planar-to-coaxial translation) of the construction and impedance characteristics of a transmission line or improved manufacturing and assembly of the first, second and third coaxial cable connectors. The table is not meant to limit particular features to particular embodiments of the coaxial cable connector, but to facilitate clarity and understanding of the various exemplary combinations of the various features with respect to the various embodiments of the coaxial cable connector shown and described herein. The table is not meant to limit the features relevant or advantageous to the particular embodiments of the coaxial cable connector. Further, the various features shown and described for one embodiment may be used on another embodiment, if permitted or desired. Hence, the multiple features and multiple embodiments may be combined in various ways to create many different designs.

| Feature | First Coaxial Cable Connector (FIGS. 1–10) | Second Coaxial Cable Connector (FIGS. 11–28) | Third Coaxial Cable Connector (FIGS. 29–33) |
|---|---|---|---|
| 1. Edge connector having a common ground contact for multiple coaxial cables. | Yes | No (single coaxial cable) | Yes (conductive block) No (non-conductive block) |
| 2. Impedance matching modification provided with the edge connector. | Yes | Yes | Yes |
| 3. Signal contact having a spring member integrally formed with a center conductor receptacle. | Yes | Yes | Yes |
| 4. Edge connector having an integral mechanism for securing the edge connector directly to the pcb. | No (Edge connector block secured to case) | Yes | No (Edge connector block secured to pcb header) |
| 5. Edge connector having a ground contact integrally formed with the housing. | No (Edge connector block uses separate ground contacts) | Yes | Yes |

B. First Coaxial Cable Connector

1. Complete Assembly for the First Coaxial Cable Connector

Figure 2:
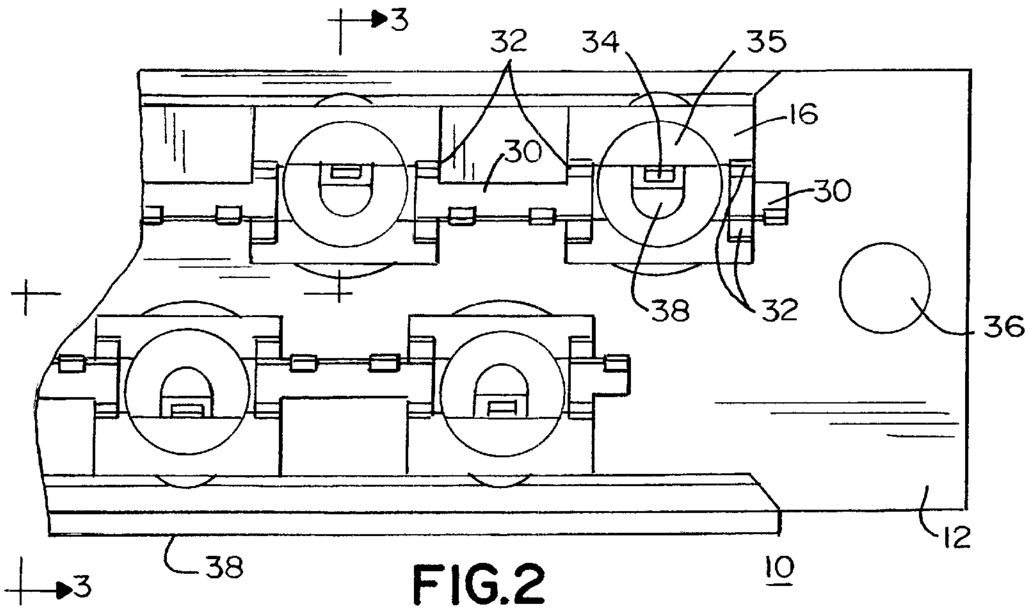
FIG. 2 illustrates a front side elevation view of the first coaxial cable connector, as shown in FIG. 1, in accordance with the first preferred embodiment of the present invention.
Figure 3:
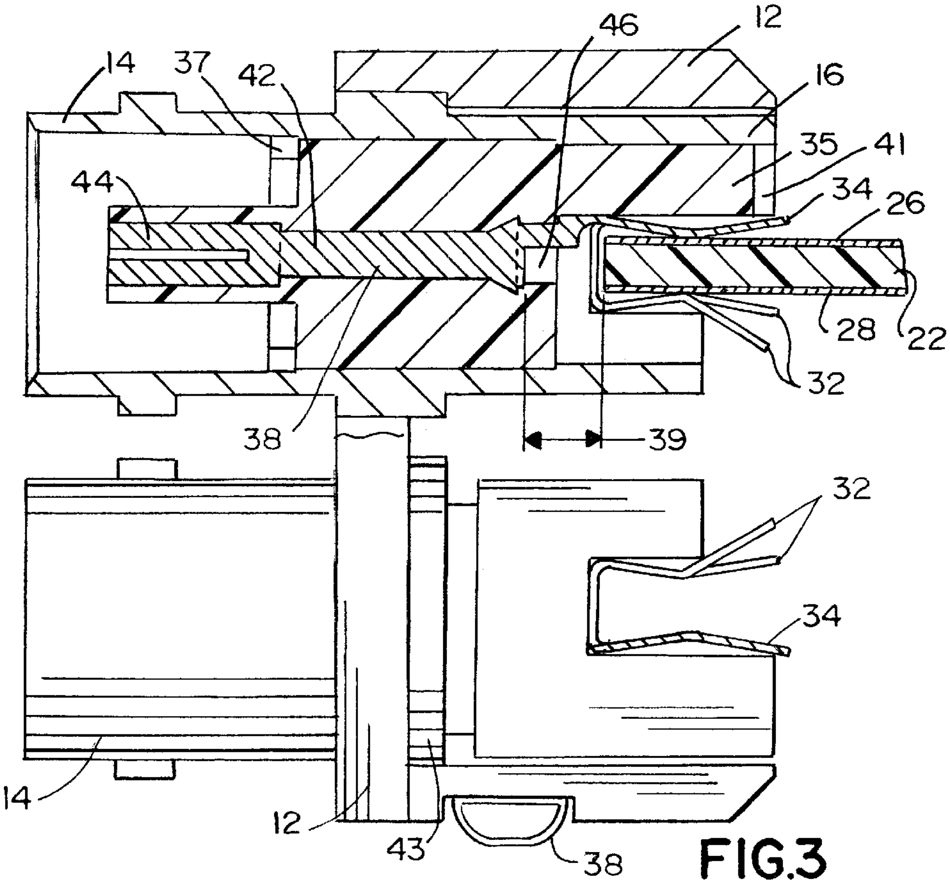
FIG. 3 illustrates a cross-sectional view of the coaxial cable connector, as shown in FIGS. 1 and 2, in accordance with the first preferred embodiment of the present invention.
Figure 6:
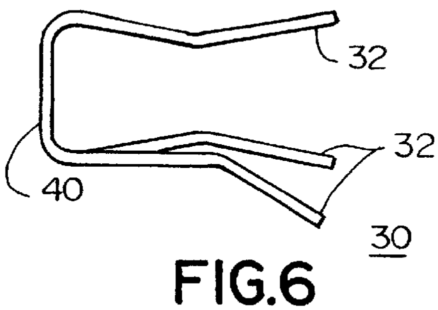
FIG. 6 illustrates a left side elevation view of the common ground contact, after being formed, as shown in FIGS. 4 and 5 and for use with the first coaxial cable connector shown in FIGS. 1, 2 and 3, in accordance with the first preferred embodiment of the present invention.
Figure 5:
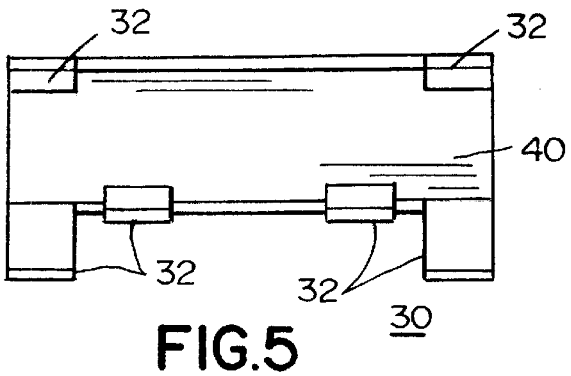
FIG. 5 illustrates a front side elevation view of the common ground contact, after being formed, as shown in FIG. 4 and for use with the first coaxial cable connector shown in FIGS. 1, 2 and 3, in accordance with the first preferred embodiment of the present invention.
Figure 4:
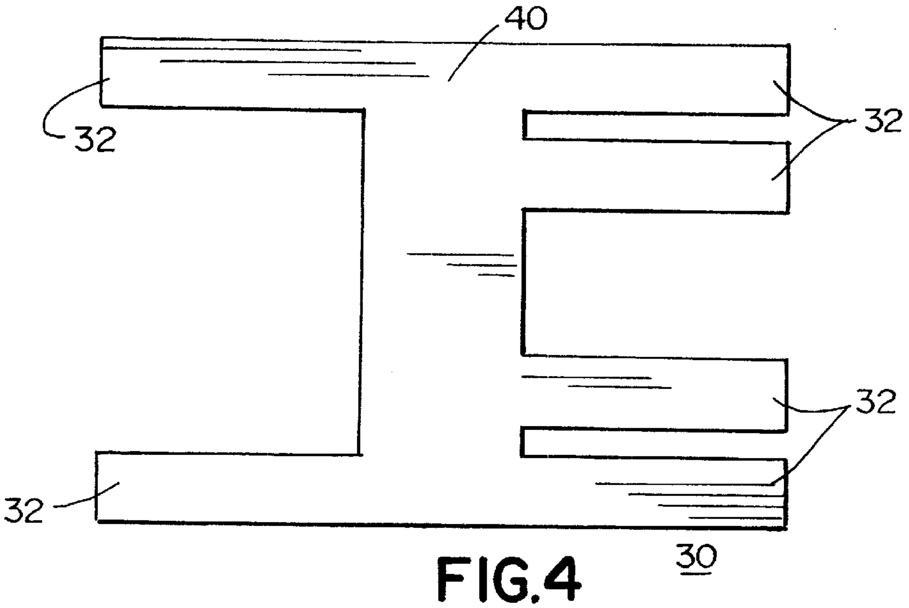
FIG. 4 illustrates a top side plan view of a common ground contact, before being formed, for use with the first coaxial cable connector shown in FIGS. 1, 2 and 3, in accordance with the first preferred embodiment of the present invention.

FIGS. 1, 2 and 3 illustrate three different views of the same complete assembly of the first coaxial cable connector 10 of the first preferred embodiment and are described together. FIG. 1 illustrates a front, top and right side perspective view of the first coaxial cable connector 10 including a solder-less printed circuit board edge connector 16 for a plurality of coaxial cables 20, in accordance with a first preferred embodiment of the present invention. FIG. 2 illustrates a front side elevation view of the first coaxial cable connector 10, as shown in FIG. 1, in accordance with the first preferred embodiment of the present invention. FIG. 3 illustrates a cross-sectional view of the coaxial cable connector 10, as shown in FIGS. 1 and 2, in accordance with the first preferred embodiment of the present invention.

Figure 10:
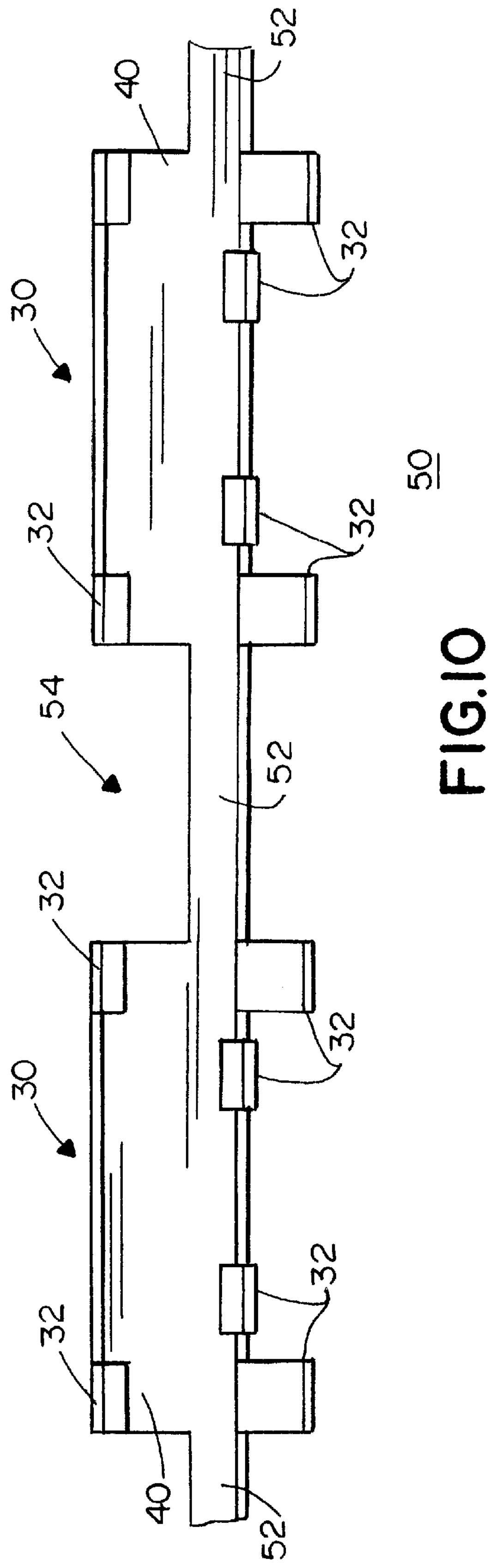
FIG. 10 illustrates a front elevation view of a plurality of interconnected common ground contacts, after being formed, as shown in FIGS. 4, 5 and 6 and for use with the first coaxial cable connector shown in FIGS. 1, 2 and 3, in accordance with the first preferred embodiment of the present invention.
Figures 11, 12:
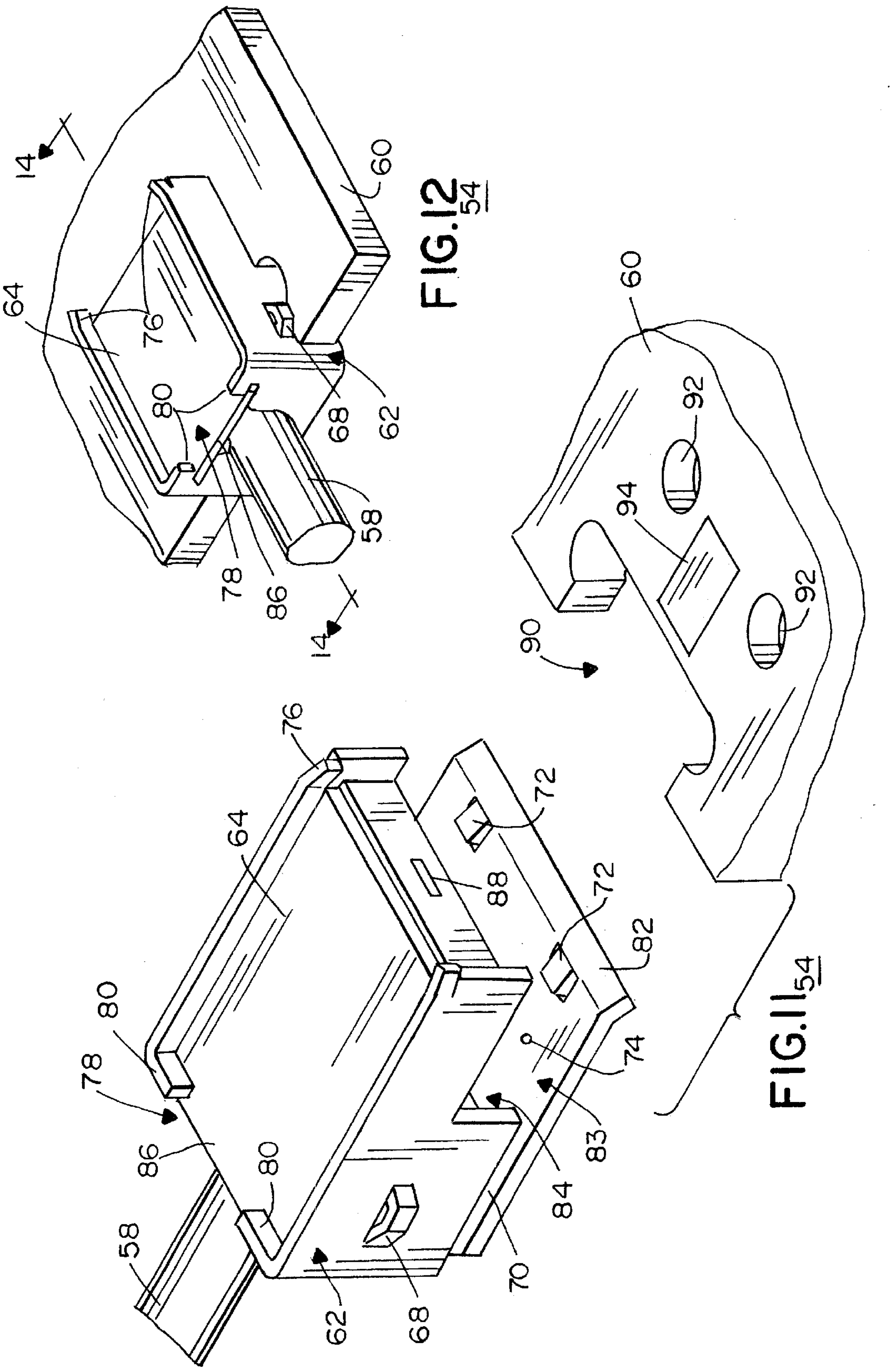
FIG. 11 illustrates a top, left and front side perspective view of a second coaxial cable connector including a solder-less printed circuit board edge connector for a single coaxial cable and positioned next to an edge of a printed circuit board, in accordance with a second preferred embodiment of the present invention.
FIG. 12 illustrates a top, left and rear side perspective view of the second coaxial cable connector connected to the edge of the printed circuit board, as shown in FIG. 11, in accordance with the second preferred embodiment of the present invention.

The coaxial cable connector 10 generally includes a panel 12, a plurality of female BNCs as represented by the female BNC 14, and a plurality of solder-less printed circuit board edge connectors as represented by edge connector 16. The female BNC 14 extends from a first side of the panel 12. Preferably, the panel 12 is made from a conductive material, such as, for example, metal. Alternatively, the panel may be made from a non-conductive material. The edge connector 16 extends from a second side of the panel 12 that is opposite to the first side of the panel 12. Preferably, the female BNC 14 and the edge connector 16 are integrally formed as a unitary unit from the same conductive material, such as, for example, metal, as best shown in FIG. 10. Alternatively, the female BNC 14 and the edge connector 16 each may be formed separately from a conductive material, such as metal, and separately electrically and mechanically coupled to the panel 12. Preferably, the conductive material of the panel 12, the female BNC and the edge connector 16 are electrically coupled to a ground potential.

On the first side of the panel 12, a plurality of male BNCs, as represented by male BNC 18, are electrically and mechanically coupled to a plurality of coaxial cables, as represented by coaxial cable 20, as are well known in the art. Preferably, the female BNC 14 is adapted to be electrically and mechanically coupled to and decoupled from the male BNC 18, as is well known in the art. Alternatively, other types of coaxial cable connectors, such as, without limitation, a threaded screw-type coaxial connector, may be used, as are well known in the art. Preferably, the panel 12 carries two parallel rows of sixteen female BNCs 14 for each row for a total of thirty-two female BNCs 14, wherein each of the thirty-two female BNCs 14 is adapted to be electrically and mechanically coupled to thirty-two male BNCs 18, respectively. The two parallel rows of sixteen female BNCs 14 for each row and the corresponding two parallel rows of edge connectors 16 for each row are offset from each other along their respective parallel planes to provide a compact arrangement. Preferably, the panel 12 having the thirty-two female BNCs 14 is used as a router for video signals, such as, without limitation, for high definition television (HDTV) video signal routers. However, the first coaxial cable connector 10 may be used to connect multiple coaxial cables to a printed circuit board for other applications besides video signal routers.

On the second side of the panel 12, the two parallel rows of edge connectors 16 are adapted to be electrically and mechanically coupled to and decoupled from two parallel printed circuit boards 22 and 24, respectively. Mechanically, each of the edge connectors 16 have opposing coplanar slots (not numbered) that are aligned with each other among the various edge connectors 16 and adapted to receive the edge of the printed circuit board 22 or 24. Electrically, each of the printed circuit boards 22 and 24 have a plurality of signal contacts, as represented by, a signal contact 26, and a plurality of ground contacts, as represented by ground contact 28. The arrangement of the signal contact 26 relative to the ground contact 28 forms a transmission line on the printed circuit board 22 and 24. Preferably, the transmission line includes a thin strip of metal, forming the signal contact 26, positioned between two wide strips of metal, forming the ground contact 28, on the top side of the printed circuit board 22 and 24, and a metal area on the bottom side of the printed circuit board 22 and 24, also forming the ground contact 28 in the form of a ground plane. The length of the thin strip of metal, forming the signal contact 26, is not material, since the impedance of the transmission line is determined by the width of the thin strip of metal, the dielectric constant of the printed circuit board 22 and 24 and thickness of the printed circuit board 22 and 24. A transmission line formed on a printed circuit board is generally known as a micro-strip, as is well known in the art. The transmission line may otherwise be known as a planar micro-strip, a planar strip-line, or a co-planar transmission line. Generally, the construction of a transmission line on a printed circuit board is well known in the art.

The first coaxial cable connector 10 provides the female BNCs 14 extending from the first side of the panel 12 and the edge connectors 16 extending from the second side of the panel 12. Alternatively, the first coaxial cable connector 10 may be constructed having the edge connectors 16 extending from both the first and the second sides of the panel 12. In this case, the first coaxial cable connector 10 would advantageously provide a connection between the edges of two printed circuit boards each having transmission lines formed thereon. Preferably, the two printed circuit boards are coplanar, but may be located in different planes, if permitted or desired.

Preferably, the printed circuit boards 22 and 24 are positioned at a fixed distance from each other so that the ground contact 28 forming the ground plane faces towards each other, and, consequently the thin strips of metal, forming the signal contacts 26, face away from each other. Essentially, bottom printed circuit board 24 is upside down with respect to the top printed circuit board 22. Hence, the bottom row of edge connectors 16 is constructed to be upside down with respect to the top row of edge connectors 16 to provide appropriate electrical coupling to the bottom printed circuit board 24 and the top printed circuit board 22, respectively. This upside down construction advantageously minimizes interference between the transmission lines on each of the two printed circuit boards 22 and 24.

The edge connector 16 generally includes a ground contact 30 having spring members 32, a signal contact 38 having a spring member 34, and an insulator 35. The ground contact 30 is electrically and mechanically coupled to the ground potential of the coaxial cable 20, preferably via the opposing coplanar slots on the edge connector 16 integrally formed with the female BNC 14, as described above. The ground contact 30 is electrically and mechanically coupled to the ground potential of the printed circuit boards 22 and 24, via the spring members 32. During assembly of the first coaxial cable connector 10 to the printed circuit boards 22 and 24, the ground contact 30 is preferably mechanically coupled to the printed circuit boards 22 and 24 by fitting the ground contact 30 to the edges of the printed circuit boards 22 and 24, as a first step, and then press fitting the opposing coplanar slots on the edge connectors 16 to the ground contact 30, as a second step. Using this sequence of steps advantageously aligns the ground contact 30 to the printed circuit boards 22 and 24 without inadvertently bending one of the spring members 32 the wrong way, especially when the first coaxial cable connector 10 connects to the printed circuit boards 22 and 24 in a blind fit assembly. Further, this sequence of steps also permits the ground contact 30 to be replaced easily if they become damaged. Hence, once the ground contact 30 with the spring members 32 are properly fit to the edges of the printed circuit boards 22 and 24, then the opposing coplanar slots on the edge connectors 16 are easily aligned to and fit to the ground contact 30 already fit to the printed circuit boards 22 and 24. Alternatively, the ground contact 30 may be mechanically coupled to the opposing coplanar slots on the edge connectors 16, using for example and without limitation, solder or welding. In this case, the first coaxial cable connector 10 assembles to the printed circuit boards 22 and 24 by aligning and fitting the spring members 32 of ground contact 30, disposed in the opposing coplanar slots on the edge connectors 16, to the edges of the printed circuit boards 22 and 24 at the same time.

Preferably, the edge of the printed circuit board 22 and 24 are tapered to facilitate easy insertion between the spring members 32 of the ground contact 30 and the spring member 34 of the signal contact 38.

Preferably, the ground contact 30 is electrically and mechanically coupled to the ground potential of more than one edge connector 16, as best shown in FIGS. 1 and 2. The ground contact 30 has a sufficient length to bridge from a slot in one edge connector 16 to an adjacent slot in an adjacent edge connector 16. The length of the ground contact 30 permits additional spring members 32 on the ground contact 30 to be formed along the length of the ground contact 30 between the adjacent edge connectors 16. Preferably, the additional spring members 32 are positioned only on one side of the ground contact 30 that electrically couples to the ground contact 28 forming the ground plane on the back side of the printed circuit boards 22 and 24. A ground contact 30 that is common to more than one edge connector 16 advantageously increases the assembly efficiency of the ground contact 30 to the printed circuit boards 22 and 24 or to the edge connectors 16 because fewer separate piece parts forming the ground contact 30 are needed. Further, a ground contact 30 that is common to more than one edge connector 16 advantageously permits additional spring members 32 to be used to increase the effectiveness of the electrical coupling of the ground contact 30 to the printed circuit boards 22 and 24.

The signal contact 38 is held by the insulator 35 in a fixed position that is substantially centered inside a cavity (not numbered) in the edge connector 16. A first end of the signal contact 38 has a spring member 34 and a second end of the signal contact 38 that is opposite to the first end has a receptacle 44. The spring member 34 is electrically and mechanically coupled to the signal contact 26 on the printed circuit board 22 and 24. The receptacle 44 is electrically and mechanically coupled to a center conductor (not shown) of the coaxial cable 20. Hence, the signal contact 38 electrically couples a signal from the center conductor of the coaxial cable 20, through the receptacle 44, through the spring member 34, then to the signal contact on the printed circuit board 22 and 24.

Figure 7:
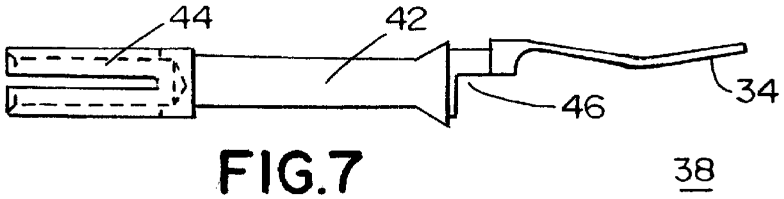
FIG. 7 illustrates a left side elevation view of a signal contact, after being formed, for use with the first coaxial cable connector shown in FIGS. 1, 2 and 3, in accordance with the first preferred embodiment of the present invention.
Figure 9:
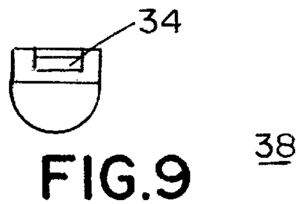
FIG. 9 illustrates a front side elevation view of the signal contact, after being formed, as shown in FIGS. 7 and 8 and for use with the coaxial cable connector shown in FIGS. 1, 2 and 3, in accordance with the first preferred embodiment of the present invention.
Figure 8:
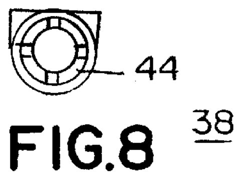
FIG. 8 illustrates a rear side elevation view of the signal contact, after being formed, as shown in FIG. 7 and for use with the first coaxial cable connector shown in FIGS. 1, 2 and 3, in accordance with the first preferred embodiment of the present invention.

The receptacle 44 forms a cavity, as best shown in FIG. 7, having a shape, such as, without limitation, cylindrical, square, rectangular or oval, and adapted to receive the center conductor of the coaxial cable 20. The receptacle 44 may be electrically and mechanically coupled to the center conductor of the coaxial cable 20 using a variety of techniques, such as, without limitation, crimping, soldering, press fitting, and the like. Preferably, the center conductor of the coaxial cable 20 is press fit into the receptacle 44 because the receptacle 44 provides the center conductor hole for the female BNC 14 on the first coaxial cable connector 10, as best shown in FIG. 2. Hence, the same receptacle 44 that electrically couples the signal to the spring member 34 also advantageously acts as the center conductor hole for the female BNC 14 which reduces parts count, material cost and assembly time.

When the edge connector 16 is fitted to the edge of the printed circuit board 22 and 24, the edge of the printed circuit board 22 and 24 comes in close proximity to the signal contact 38. The spring member 34 electrically couples the signal of the transmission line to the signal contact 26 on the top of the printed circuit board 22 and 24 so the close proximity is a benefit. However, the signal contact 38 also comes in close proximity to the ground contact 28, forming a ground plane, on the bottom of the printed circuit board 22 and 24, which may be a detriment, depending on the particular application of that the first coaxial cable connector 10. A parasitic capacitance may appear between the signal contact 38 and the ground contact 28, forming a ground plane, on the bottom of the printed circuit board 22 and 24 due to the signal on the signal contact 38 being misdirected to the ground contact 28, forming a ground plane, on the bottom of the printed circuit board 22 and 24. The parasitic capacitance alters the impedance characteristic of the transmission line, formed by the edge connector 16. Techniques for reducing this parasitic capacitance include one or more of: 1) decreasing the area of the signal contact 38 and/or the ground contact 28, 2) increasing the distance between the signal contact 38 and the ground contact 28, and 3) decreasing the dielectric constant between the between the signal contact 38 and the ground contact 28. Preferably, the parasitic capacitance is reduced by a combination of decreasing the area of the signal contact 38 and by increasing the distance 39 between the signal contact 38 and the ground contact 28, as best shown in FIG. 3. Both of these techniques are implemented at the same time by removing some of a center portion 42 of the signal contact 38 near the spring member 34 on the bottom side closest to the ground contact 28. The removed portion of the signal contact 38 effectively forms a notch 46 in the end of the center portion 42 of the signal contact 38 near the spring member 34. Hence, the implementation of these two techniques on the first coaxial cable connector 10 by modifying or adjusting the first coaxial cable connector 10 alone advantageously reduces the parasitic capacitance, without modifying or adjusting the printed circuit board 22 and 24.

Alternatively, an analogous reduction of the parasitic capacitance may be achieved using the same combination of techniques by removing a portion of the ground contact 102, forming the ground plane, at the edge of the printed circuit board 60 closest to the signal contact 98. Still alternatively, an analogous reduction of the parasitic capacitance may be achieved using the same combination of techniques by removing some of receptacle 106 of the signal contact 98 near the spring member 96 on the bottom side closest to the ground contact 102 and by removing a portion of the ground contact 102, forming the ground plane, at the edge of the printed circuit board 60 closest to the signal contact 98.

Note that a corresponding increase in the capacitance may be achieved, if desired, by performing one or more of: 1) increasing the area of the signal contact 98 and/or the ground contact 102, 2) decreasing the distance between the signal contact 98 and the ground contact 102, and 3) increasing the dielectric constant between the between the signal contact 98 and the ground contact 102. Hence, a combination of one or more of these three techniques advantageously permits the impedance characteristic of the transmission line, formed by the second coaxial cable connector 54, to be appropriately adjusted.

Figure 14:
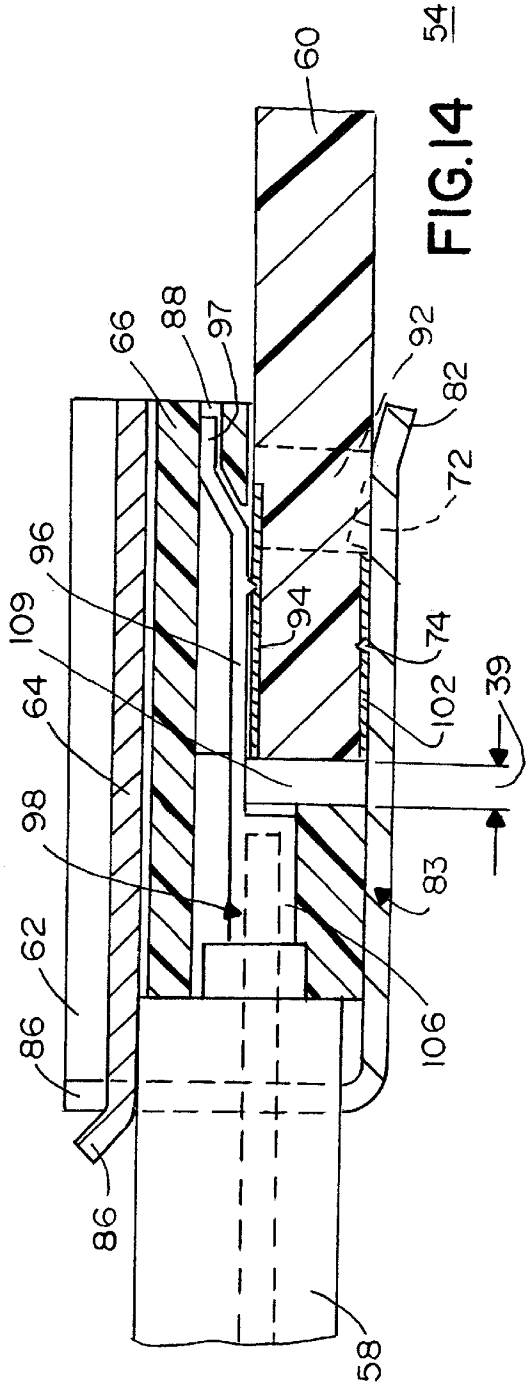
FIG. 14 illustrates a cross-sectional view of the second coaxial cable connector, as shown in FIG. 12, connected to the edge of the printed circuit board, in accordance with the second preferred embodiment of the present invention.

Further, when the second coaxial cable connector 54 is fitted to the edge of the printed circuit board 60, a high inductance may form between the second coaxial cable connector 54 and the printed circuit board 60 when the construction and impedance characteristics of the transmission line, formed in the second coaxial cable connector 54, do not extend far enough along the transmission line, formed as a micro-strip line, on the printed circuit board 60. Essentially, the transition from the transmission line structure of the second coaxial cable connector 54 and the transmission line structure of the printed circuit board 60 should not be abrupt and, therefore, should be gradual to permit the signal to transfer and translate from one structure to the other structure without significant loss or degradation. To facilitate a gradual transfer and translation of the signal from the transmission line structure of the second coaxial cable connector 54 and the transmission line structure of the printed circuit board 60, without significant loss or degradation, the second coaxial cable connector 54 is made to overhang or extend along the side of the printed circuit board 60 having the signal contact 94 that receives the signal contact 98 of the second coaxial cable connector 54. Each of the spring member 96 of the signal contact 98, the housing 62 and the insulator 66 of the second coaxial cable connector 54 extend across the printed circuit board 60, as best shown in FIG. 14. The distance of the extension is preferably calculated and/or empirically measured to ensure an appropriate gradual transfer and translation of the signal. Therefore, the extension of the second coaxial cable connector 54 along the side of the printed circuit board 60 advantageously provides a gradual transfer and translation of the signal to reduce the inductance, and thereby providing a proper impedance match between the second coaxial cable connector 54 and the printed circuit board 60.

Figure 13:
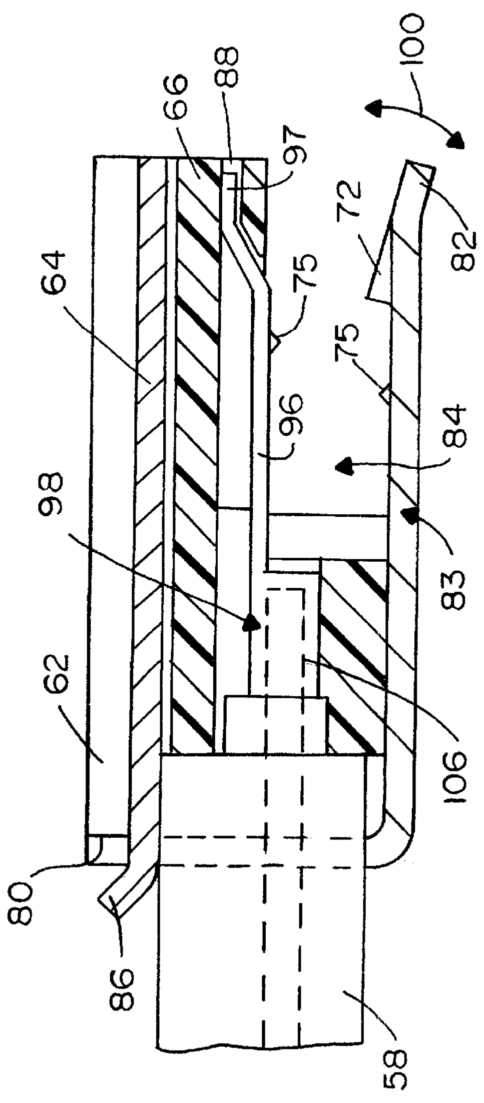
FIG. 13 illustrates a cross-sectional view of the second coaxial cable connector, as shown in FIG. 11, not connected to the edge of the printed circuit board, in accordance with the second preferred embodiment of the present invention.

Preferably, the insulator 66 is made from a suitable dielectric material, such as, without limitation, Teflon ®, and the like. The insulator 66 provides two primary functions. The first function of the insulator 66 is to hold the signal contact 98 in a fixed position that is substantially centered inside a cavity (not numbered) in the housing 62, as best shown in FIGS. 13 and 14. Preferably, the cavity is formed as a rectangular hole in the housing 62. As described above, the housing 62 is at the ground potential. Hence, the signal contact 98, having the signal potential, is substantially centered inside the housing 62, having the ground potential, similar to a transmission line formed of the coaxial cable 58. Further, the signal contact 98, having the signal potential, is substantially centered among the lid 64, the spring plate 83 forming the ground contact and the left and right opposing sides of the housing 62, each having the ground potential, similar to a transmission line formed of the coaxial cable 58. Hence, the housing 62, the lid 64, and/or the spring plate 83 forming the ground contact provide a distributed ground potential around the signal contact 98. The second function of the insulator 66 is to provide a predetermined dielectric constant between the ground potential on the housing 62 and the lid 64, and the signal potential on the signal contact 98. Each of these two primary functions advantageously mimic or approximate the unbalanced construction and impedance characteristics of a transmission line to provide an efficient coaxial-to-planar (or planar-to-coaxial) transition between the transmission line, formed by the coaxial cable 58, and the transmission line, formed by the micro-strip 94 on the printed circuit board 60.

The second coaxial cable connector 54 is assembled in the following sequential steps, after each of the required parts are formed or machined. First the receptacle 106 of the signal contact 98 is mechanically and electrically coupled to the center conductor of the coaxial cable 58. Second, the signal contact 98 is positioned in the insulator 66. Third, the insulator 66 is positioned in the housing 62, and, at the same time, the coaxial cable 58 is positioned in the slot 78. Fourth, the lid 64 is positioned on the housing 62.

2. Housing For The Second Coaxial Cable Connector

Figure 18:
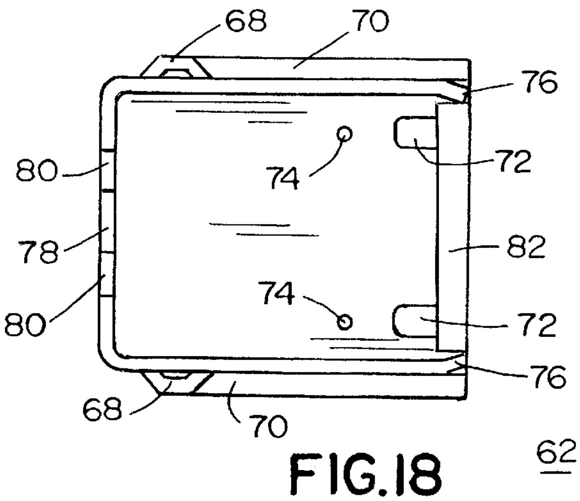
FIG. 18 illustrates a top side plan view of the housing, after being formed, as shown in FIGS. 15, 16 and 17, in accordance with the second preferred embodiment of the present invention.
Figure 17:
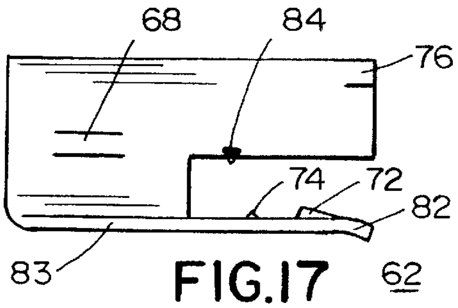
FIG. 17 illustrates a left side elevation view of the housing, after being formed, as shown in FIGS. 16 and 17, in accordance with the second preferred embodiment of the present invention.
Figure 16:
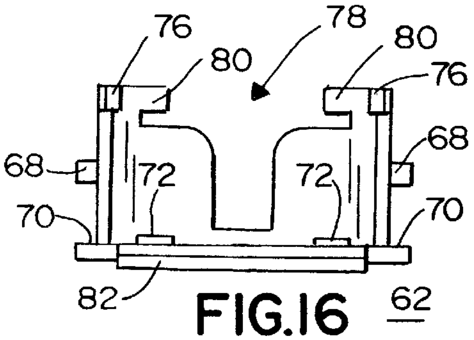
FIG. 16 illustrates a rear side elevation view of the housing, after being formed, as shown in FIG. 15, in accordance with the second preferred embodiment of the present invention.
Figure 15:
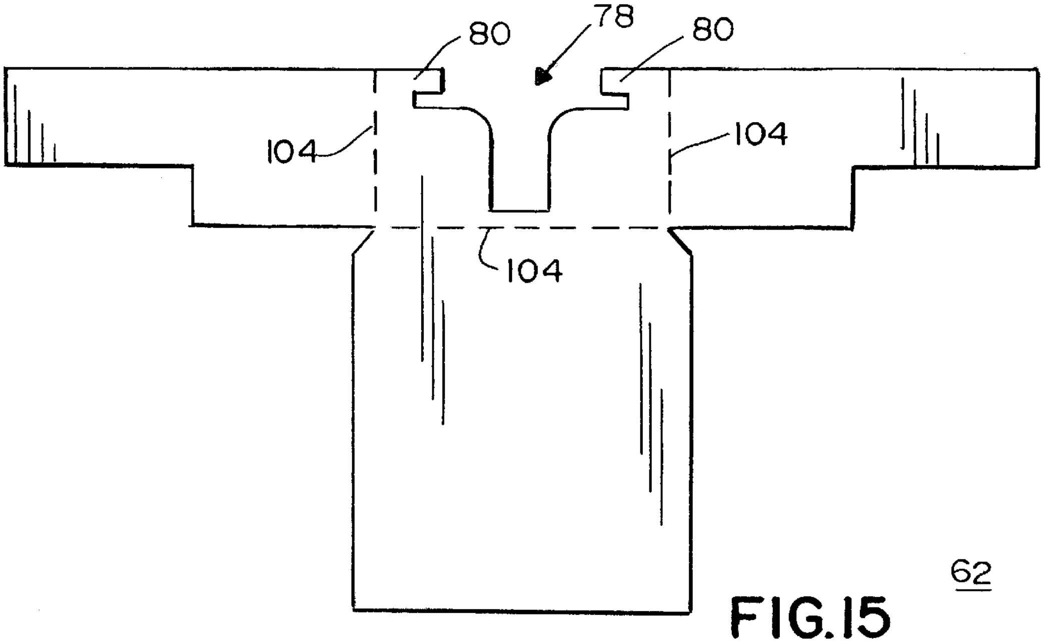
FIG. 15 illustrates a top side plan view of a housing, before being formed, for use with the second coaxial cable connector, as shown in FIGS. 11, 12, 13 and 14, in accordance with the second preferred embodiment of the present invention.

FIGS. 15, 16, 17 and 18 illustrate four different views of the same housing 62 for use with the second coaxial cable connector 54 of the second preferred embodiment and are described together. FIG. 15 illustrates a top side plan view of the housing 62, before being formed, for use with the second coaxial cable connector 54, as shown in FIGS. 11, 12, 13 and 14, in accordance with the second preferred embodiment of the present invention. FIG. 16 illustrates a rear side elevation view of the housing 62, after being formed, as shown in FIG. 15, in accordance with the second preferred embodiment of the present invention. FIG. 17 illustrates a left side elevation view of the housing 62, after being formed, as shown in FIGS. 16 and 17, in accordance with the second preferred embodiment of the present invention. FIG. 18 illustrates a top side plan view of the housing 62, after being formed, as shown in FIGS. 15, 16 and 17, in accordance with the second preferred embodiment of the present invention.

Various features and advantages of the housing 62 are described above with reference to FIGS. 11 through 14. FIG. 15 indicates three bend lines 104 indicating where the left and right opposing sides and the bottom side of the housing 62 are folded from a piece of stock to form the housing 62.

3. Insulator for the Second Coaxial Cable Connector

Figure 19:
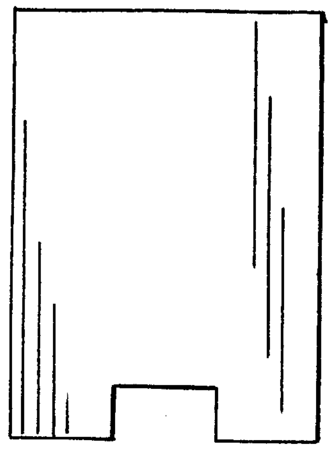
FIG. 19 illustrates a top side plan view of an insulator for use with the second coaxial cable connector, as shown in FIGS. 1, 12, 13 and 14, in accordance with the second preferred embodiment of the present invention.
Figure 20:
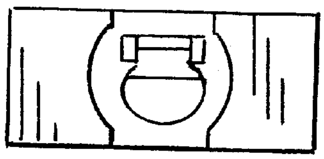
FIG. 20 illustrates a rear side elevation view of the insulator, as shown in FIG. 19, in accordance with the second preferred embodiment of the present invention.
Figure 21:
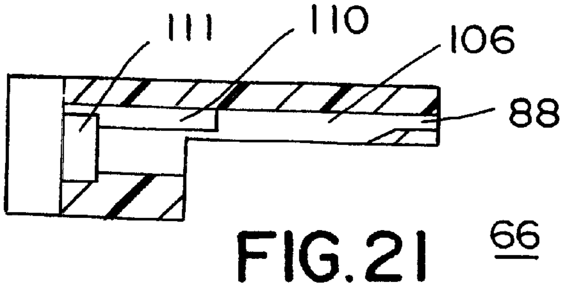
FIG. 21 illustrates a cross-sectional view of the insulator, as shown in FIGS. 19 and 20, in accordance with the second preferred embodiment of the present invention.
Figure 22:
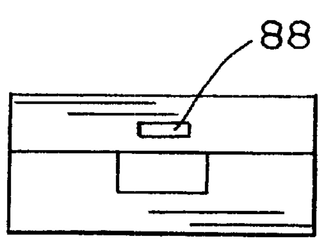
FIG. 22 illustrates a front side elevation view of the insulator, as shown in FIGS. 19, 20 and 21, in accordance with the second preferred embodiment of the present invention.

FIGS. 19, 20, 21 and 22 illustrate four different views of the same insulator 66 for use with the second coaxial cable connector 54 of the second preferred embodiment and are described together. FIG. 19 illustrates a top side plan view of the insulator 66 for use with the second coaxial cable connector 54, as shown in FIGS. 1, 12, 13 and 14, in accordance with the second preferred embodiment of the present invention. FIG. 20 illustrates a rear side elevation view of the insulator 66, as shown in FIG. 19, in accordance with the second preferred embodiment of the present invention. FIG. 21 illustrates a cross-sectional view of the insulator 66, as shown in FIGS. 19 and 20, in accordance with the second preferred embodiment of the present invention. FIG. 22 illustrates a front side elevation view of the insulator 66, as shown in FIGS. 19, 20 and 21, in accordance with the second preferred embodiment of the present invention.

Various features and advantages of the insulator 66 are described above with reference to FIGS. 11 through 14. The insulator 66 further includes a hole 88 for receiving the front end 97 of the spring member 96 of the signal contact 98. The hole 88 helps to hold the signal contact 98 in the insulator 66, and to protect the front end 97 of the spring member 96 from being stubbed into the edge of the printed circuit board 60. Other features of the insulator 66, such as the cavities 110 and 111, also help to position and to secure the signal contact 98 in the insulator 66.

4. Signal Contact for the Second Coaxial Cable Connector

Figure 26:
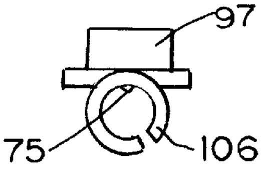
FIG. 26 illustrates a rear side elevation view of the signal contact, after being formed, as shown in FIGS. 23, 24 and 25, in accordance with the second preferred embodiment of the present invention.
Figure 25:
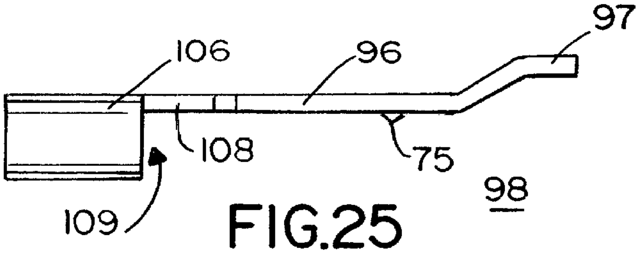
FIG. 25 illustrates a left side elevation view of the signal contact, after being formed, as shown in FIGS. 23 and 24, in accordance with the second preferred embodiment of the present invention.
Figure 24:
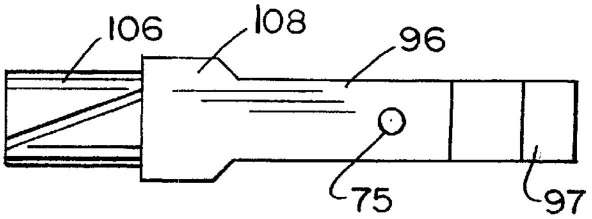
FIG. 24 illustrates a bottom side plan view of the signal contact, after being formed, as shown in FIG. 23, in accordance with the second preferred embodiment of the present invention.
Figure 23:
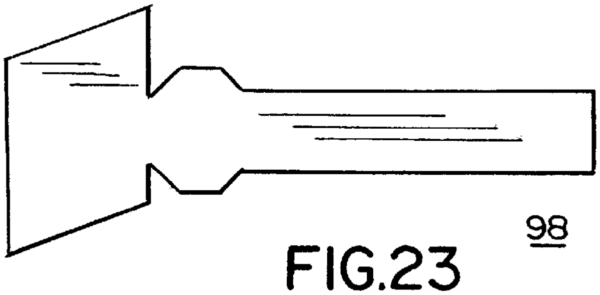
FIG. 23 illustrates a top side plan view of a signal contact, before being formed, for use with the second coaxial cable connector, as shown in FIGS. 11, 12, 13 and 14, in accordance with the second preferred embodiment of the present invention.

FIGS. 23, 24, 25 and 26 illustrate four different views of the same signal contact 98 for use with the second coaxial cable connector 54 of the second preferred embodiment and are described together. FIG. 23 illustrates a top side plan view of the signal contact 98, before being formed, for use with the second coaxial cable connector 54, as shown in FIGS. 11, 12, 13 and 14, in accordance with the second preferred embodiment of the present invention. FIG. 24 illustrates a bottom side plan view of the signal contact 98, after being formed, as shown in FIG. 23, in accordance with the second preferred embodiment of the present invention. FIG. 25 illustrates a left side elevation view of the signal contact 98, after being formed, as shown in FIGS. 23 and 24, in accordance with the second preferred embodiment of the present invention. FIG. 26 illustrates a rear side elevation view of the signal contact 98, after being formed, as shown in FIGS. 23, 24 and 25, in accordance with the second preferred embodiment of the present invention.

Various features and advantages of the signal contact 98, including the spring member 96, the receptacle 106, the notch 109, and the signal point 75 are described above with reference to FIGS. 11 through 14.

The receptacle 106 further includes a slot (not numbered) formed therein and positioned at an angle to the central axis of the receptacle 106, as best shown in FIG. 24. The slot permits the signal contact 98, including the receptacle 106, to be formed from a blank piece of stock, as best shown in FIG. 23 and permits the receptacle 106 to be crimped to the center conductor of the coaxial cable 58.

Preferably, the spring member 96 at the first end of the signal contact 98 is formed in sloped step-shaped pattern. The inside of the sloped step-shaped pattern faces towards the notch 109. The sloped step-shaped pattern provides a resilient spring force to the spring member 96 when forced against the insulator 66. The width of the spring member 96 is appropriately sized for making electrical contact to the signal contact 94 on the printed circuit board 66.

The flange portion 108 of the signal contact 98 is adapted to be disposed in the cavity 110 of the insulator 66 to help position and secure the signal contact 98 in the insulator 66. The receptacle 106 of the signal contact 98 is adapted to be disposed in the cavity 111 of the insulator 66 to help position and secure the signal contact 98 in the insulator 66.

Preferably, the signal contact 98 is integrally formed as a unitary unit, but may include separate parts. Preferably, the signal contact 98 is formed from a blank piece of metal stock, but may be machine formed, if permitted or desired. The signal contact 98 is made from an appropriate conductive material, such as, without limitation, metal, and may be plated with an appropriate conductive material, such as, without limitation, gold.

5. Lid for the Second Coaxial Cable Connector

Figure 28:
FIG. 28 illustrates a left side elevation view of the lid, after being formed, as shown in FIG. 27, in accordance with the second preferred embodiment of the present invention.
Figure 27:
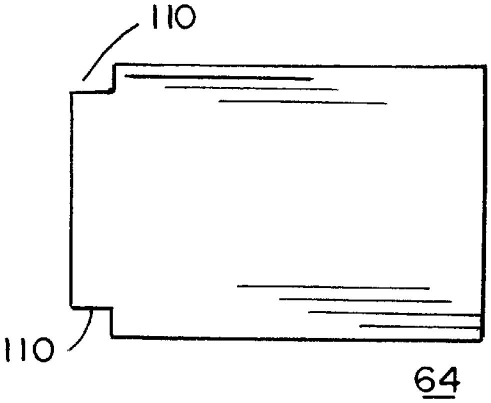
FIG. 27 illustrates a top side plan view of a lid, before being formed, for use with the second coaxial cable connector, as shown in FIGS. 11, 12, 13 and 14, in accordance with the second preferred embodiment of the present invention.

FIGS. 27 and 28 illustrate two different views of the same lid 64 for use with the second coaxial cable connector 54 of the second preferred embodiment and are described together. FIG. 27 illustrates a top side plan view of a lid 64, before being formed, for use with the second coaxial cable connector 54, as shown in FIGS. 11, 12, 13 and 14, in accordance with the second preferred embodiment of the present invention. FIG. 28 illustrates a left side elevation view of the lid 64, after being formed, as shown in FIG. 27, in accordance with the second preferred embodiment of the present invention.

Various features and advantages of the lid 64, including the rear end 86 slightly bent upward, are described above with reference to FIGS. 11 through 14. The lid 64 also includes two opposing cutouts 110 disposed at the comers of the rear end 86. The two opposing cutouts 110 are adapted to be received in the under the two opposing tabs 80 on the housing 62 to help secure the lid 64 to the housing 62.

Preferably, the lid 64is integrally formed as a unitary unit, but may include separate parts. Preferably, the lid 64 is formed from a blank piece of metal stock, but may be machine formed, if permitted or desired. The lid 64 is made from an appropriate conductive material, such as, without limitation, metal.

6. Summary Of The Second Coaxial Cable Connector

FIGS. 11 through 28 illustrate the second coaxial cable connector 54 in accordance with the second preferred embodiment of the present invention. In the second preferred embodiment of the present invention, the second coaxial cable connector 54 includes a solder-less printed circuit board (pcb) edge connector for connecting the single coaxial cable 58 to the edge of the printed circuit board 60. The coaxial cable 58 is permanently connected to the second coaxial cable connector 54 by displacing the insulation on the coaxial cable 58 to contact the outer ground conductor of the coaxial cable 58 and by crimping the receptacle 106 of the signal contact 98 to the center signal conductor of the coaxial cable 58. The second coaxial cable connector 54 advantageously provides a coaxial-to-planar translation (or planar-to-coaxial translation) of the construction and impedance characteristics of a transmission line.

The second coaxial cable connector 54 has four of the five features described in the table above. The four features include: modifications to the second coaxial cable connector 54 and/or the printed circuit board 60 for impedance matching, the signal contact 98 having the spring member 96 integrally formed with the receptacle 106, the retention mechanism integrally formed with the second coaxial cable connector 54 for securing the second coaxial cable connector 54 directly to the printed circuit board 60, and a ground contact integrally formed with the housing 62. Note that the second coaxial cable connector 54 does not have a ground contact 30 common to multiple coaxial cables because the second coaxial cable connector 54 only has one coaxial cable. Other features and advantages of the first coaxial cable connector 10 are described above with reference to FIGS. 11 through 28.

Therefore, the second coaxial cable connector 54 advantageously eliminates a conventional coaxial cable connector header that is typically soldered to a printed circuit board by providing a solder-less edge connector between the coaxial cable 58 and the micro-strip transmission line formed on the printed circuit board 60. The second coaxial cable connector 54 advantageously reduces connector cost, eliminates printed circuit board connector rework, eliminates connector parts on the printed circuit board, reduces labor for the assembly of the connector, reduces insertion forces, enhance mating alignment between the connector and the printed circuit board, and the like.

D. Third Coaxial Cable Connector

1. Complete Assembly for the Third Coaxial Cable Connector

Figure 29:
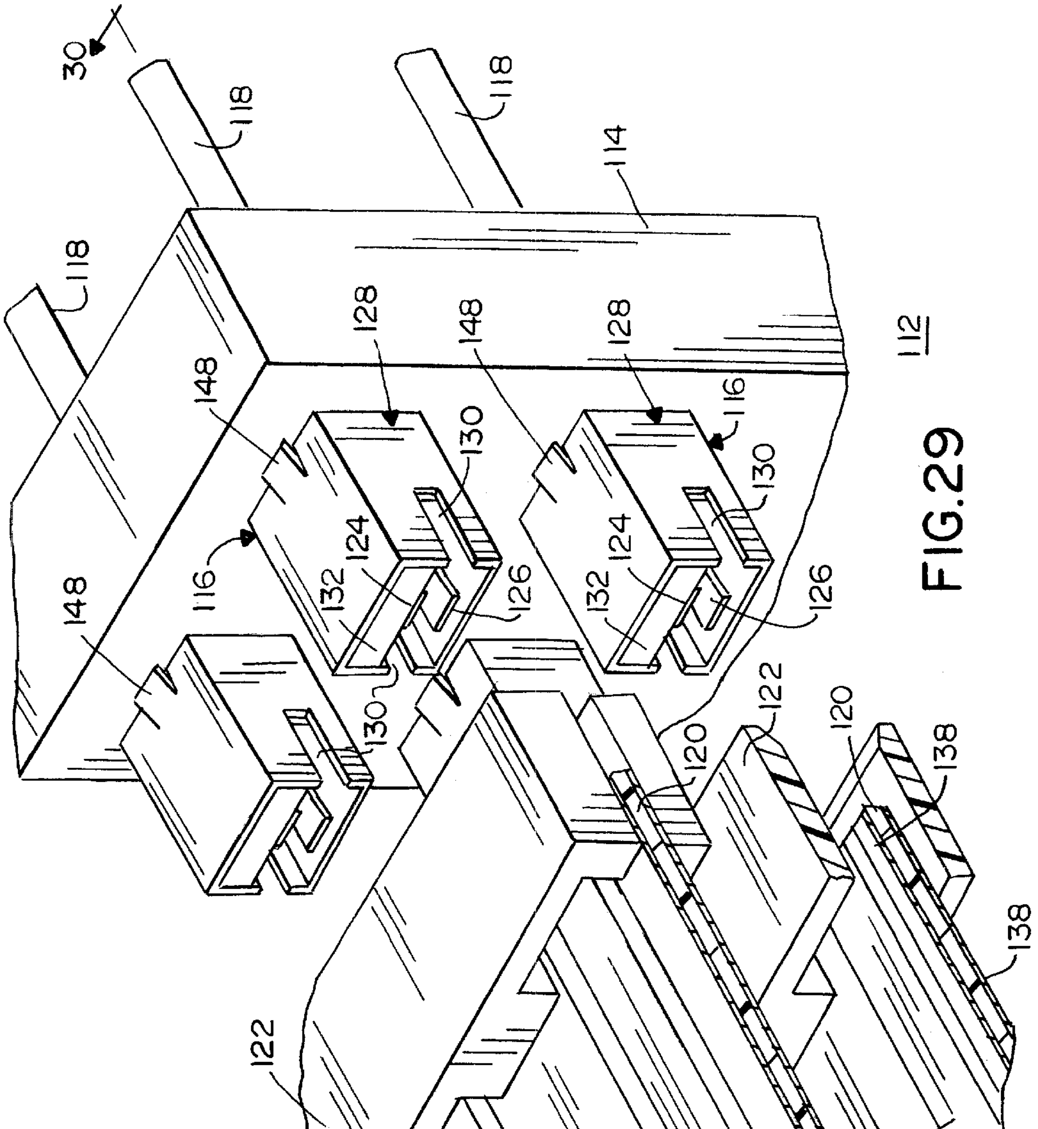
FIG. 29 illustrates a front, top and right side perspective view of a third coaxial cable connector including a solder-less printed circuit board edge connector for a plurality of coaxial cables, in accordance with a third preferred embodiment of the present invention.
Figure 30:
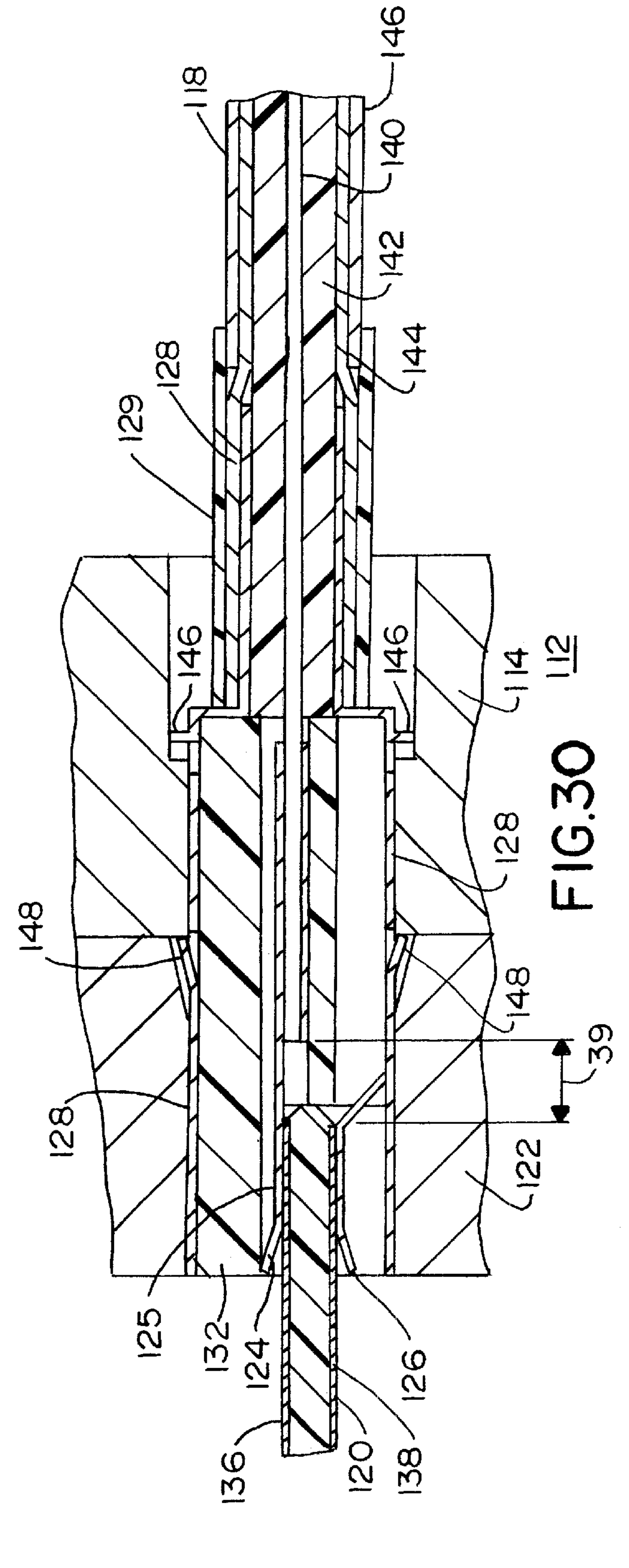
FIG. 30 illustrates a cross-sectional view of the third coaxial cable connector, as shown in FIG. 29, connected to an edge of a printed circuit board, in accordance with the third preferred embodiment of the present invention.

FIGS. 29 and 30 illustrate two different views of the same complete assembly of the third coaxial cable connector 112 of the third preferred embodiment and are described together. FIG. 29 illustrates a front, top and right side perspective view of the third coaxial cable connector 112 including a solder-less printed circuit board edge connector 116 for a plurality of coaxial cables 118, in accordance with a third preferred embodiment of the present invention. FIG. 30 illustrates a cross-sectional view of the third coaxial cable connector 112, as shown in FIG. 29, connected to an edge of a printed circuit board 120, in accordance with the third preferred embodiment of the present invention.

The third coaxial cable connector 112 generally includes a block 114 for carrying a plurality of solder-less printed circuit board edge connectors 116. Each of the edge connectors 116 have a rear end adapted to receive a transmission line, formed as the coaxial cable 118, and have a front end adapted to receive a transmission line, formed as a micro-strip line on the printed circuit board 120. Alternatively, each of the edge connectors 116 may be adapted to receive a transmission line, formed as a micro-strip line on a printed circuit board, at each of the front end and the rear end of the edge connector 116. In this case, the third coaxial cable connector 112 would provide a connection between the edges of two printed circuit boards. Preferably the edge connectors 116 have a rectangular shape, but may have other shapes, if permitted or desired.

Preferably, the third coaxial cable connector 112 carries two coaxial cables 118 along the width of the block 114 and seven coaxial cables 118 along the length of the block 114 for a total of fourteen coaxial cables 118. Each pair of two adjacent coaxial cables 118 along the width of the block 114 connects to the same printed circuit board 120. Each of the seven coaxial cables 118 along the length of the block 114 connect to seven different, parallel printed circuit boards 120. Preferably, eighteen separate third coaxial cable connectors 112 are disposed next to each other to form an extended array of coaxial cables for a total of thirty-six coaxial cables disposed adjacent to each other along each printed circuit board 120. Therefore, the total matrix of coaxial cables for the application is thirty-six coaxial cables coupled to each printed circuit board 120 for each of seven printed circuit boards 120 for a total of two hundred and fifty two coaxial cables coupled to the seven printed circuit boards. The preferred application using these two hundred and fifty two coaxial cables is an internet signal router. Other applications may use a different array of coaxial cables on a different number of printed circuit boards, as permitted or desired.

On the front side of the block 114, the two parallel rows of edge connectors 116 are adapted to be electrically and mechanically coupled to and decoupled from two parallel printed circuit boards 120, respectively. Mechanically, each of the edge connectors 116 have opposing coplanar slots 130 that are aligned with each other among the adjacent edge connectors 116 and adapted to receive the edge of the printed circuit board 120. Preferably, the edge of the printed circuit board 120 is tapered to facilitate easy insertion between the ground contact 126 and the signal contact 124. Electrically, each of the printed circuit boards 120 have a plurality of signal contacts, as represented by, a signal contact 136, and a plurality of ground contacts, as represented by ground contact 138. The arrangement of the signal contact 136 relative to the ground contact 138 forms a transmission line on the printed circuit board 120. Preferably, the transmission line includes a thin strip of metal, forming the signal contact 136, positioned between two wide strips of metal, forming the ground contact 138, on the top side of the printed circuit board 120, and a metal area on the bottom side of the printed circuit board 120, also forming the ground contact 138 in the form of a ground plane. The length of the thin strip of metal, forming the signal contact 136, is not material, since the impedance of the transmission line is determined by the width of the thin strip of metal, the dielectric constant of the printed circuit board 120 and thickness of the printed circuit board 120. A transmission line formed on a printed circuit board is generally known as a micro-strip, as is well known in the art. The transmission line may otherwise be known as a planar micro-strip, a planar strip-line, or a co-planar transmission line. Generally, the construction of a transmission line on a printed circuit board is well known in the art.

The third coaxial cable connector 112 generally includes a housing 128, an insulator 132, the signal contact 124 and the ground contact 126. The housing 128, the insulator 132, the signal contact 124 and the ground contact 126 together provide the solder-less printed circuit board edge connector 116 for each coaxial cable 118. Generally, the insulator 132 carries the signal contact 124 and the housing 128 carries the insulator 132 and the ground contact 126.

The primary features of the third coaxial cable connector 112 include: the third coaxial cable connector 112 having a common ground contact 126 for multiple coaxial cables 118 when the block 114 is conductive, modifications to the third coaxial cable connector 112 and/or the printed circuit board 120 for impedance matching, the signal contact 124 having a spring member 125 integrally formed with a receptacle 150 adapted to receive a center contact 140 of a coaxial cable 118, and a ground contact 126 integrally formed with the housing 128 of the third coaxial cable connector 112. Note that the third coaxial cable connector 112 does not have a common ground contact 126 for multiple coaxial cables 118 when the block 114 is not conductive. Further, note that the third coaxial cable connector 112 does not have an retention mechanism integrally formed with the third coaxial cable connector 112 for securing the third coaxial cable connector 112 directly to the printed circuit board 120. Instead, the third coaxial cable connector 112 is secured against the printed circuit board 120 by attaching the block 114 to a header 122 that is mounted on the edge of the printed circuit board 120.

Each edge connector 116 is disposed within a corresponding hole 154, formed in the block 114, that is adapted to receive the edge connector 116. The edge connector 116 is inserted into the hole 154 from the rear side of the block 114 and pressed through the block 114. The edge connector 116 has tabs 148 that extend from the top side and bottom side of the edge connector 116. The tabs 148 have a resilient spring or bias force associated with them. When the edge connector 116 is pressed through the block 114, the tabs 148 yield to the inward directed force applied by the top side and the bottom side of the hole 154 to cause the tabs 148 to essentially bend inward and flush with the top side and the bottom side of the edge connector 116. When the tabs clear the top and bottom edges 156 of the hole 154, the bias force on the tabs cause the tabs to extend in an outward direction adjacent to the top and bottom edges 156 of the hole 154 to prevent the edge connector 116 from backing out of the hole 154. Further, the edge connector 116 includes a flange 146 positioned on the top side and the bottom side of the edge connector 116 that engage stops 158 formed in the block 114 to prevent the edge connector 116 from extending too far through the hole 154. Hence, the tabs 148 and the flange 146 on the edge connector 116 in cooperation with the edges 156 and the stops 158, respectively, in the block 114 retain the edge connector 116 in the block 114.

Preferably, the block 114 and the header 122 are made from a non-conductive material, such as, without limitation, plastic, but may also be made from a conductive material, such as, without limitation, metal. The material of the block 114 and the header 122 depends on the application requirements including, without limitation, the frequency of the signal, shielding requirements, and the like.

Preferably, the ground contact 126 is integrally formed with the housing 128 as a unitary unit, but may be made from separate parts, if permitted or desired. Preferably, the ground contact 126 has a width equal to a width of the signal contact 124, but may also be made to have a width essentially the same as the width of the bottom side of the housing 128. Preferably, the housing 128 is made from a conductive material, such as, without limitation, metal. The ground contact 126 is electrically and mechanically coupled to the ground potential 144 of the coaxial cable 118, preferably via a crimp tube 129 pressing the ground conductor 144 of the coaxial cable against the housing 128. The ground contact 126 is electrically and mechanically coupled to the ground contact 138 on the printed circuit boards 22 and 24, via the spring members 32. Hence, making the ground contact 126 integral to the housing 128 advantageously reduces parts count, reduces cost, increases reliability, reduces assembly time, and the like.

The signal contact 124 is held by the insulator 132 in a fixed position that is substantially centered inside a cavity (not numbered) in the edge connector 116. A first end of the signal contact 124 has a spring member 125 and a second end of the signal contact 124 that is opposite to the first end has a receptacle 150. The spring member 125 is electrically and mechanically coupled to the signal contact 136 on the printed circuit board 120. The receptacle 150 is electrically and mechanically coupled to a center conductor 140 of the coaxial cable 118. Hence, the signal contact 124 electrically couples a signal from the center conductor 140 of the coaxial cable 118, through the receptacle 150, through the spring member 124, then to the signal contact 136 on the printed circuit board 120.

Figure 31:
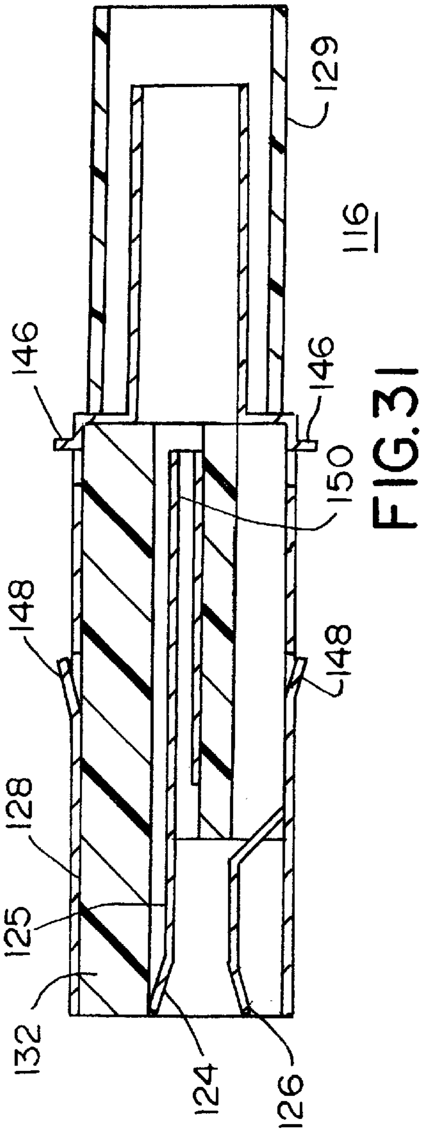
FIG. 31 illustrates a cross-sectional view of a solder-less printed circuit board edge connector for use with the third coaxial cable connector, as shown in FIGS. 29 and 30, in accordance with the third preferred embodiment of the present invention.

The receptacle 150 forms a cavity, as best shown in FIGS. 30 and 31, having a shape, such as, without limitation, cylindrical, square, rectangular or oval, and adapted to receive the center conductor of the coaxial cable 118. The receptacle 150 may be electrically and mechanically coupled to the center conductor 140 of the coaxial cable 118 using a variety of techniques, such as, without limitation, crimping, soldering, press fitting, and the like. Preferably, the center conductor 140 of the coaxial cable 118 is crimped onto the receptacle 150 to permanently attach the receptacle 150 to the center conductor 140 of the coaxial cable 118. Hence, the same receptacle 150 that electrically couples the signal to the spring member 125 also advantageously acts as the center conductor attachment mechanism, which reduces parts count, material cost and assembly time.

When the edge connector 116 is fitted to the edge of the printed circuit board 120, the edge of the printed circuit board 120 comes in close proximity to the signal contact 124. The spring member 125 electrically couples the signal of the transmission line to the signal contact 136 on the top of the printed circuit board 120 so the close proximity is a benefit. However, the signal contact 124 also comes in close proximity to the ground contact 138, forming a ground plane, on the bottom of the printed circuit board 120, which may be a detriment, depending on the particular application of that the third coaxial cable connector 112. A parasitic capacitance may appear between the signal contact 124 and the ground contact 138, forming a ground plane, on the bottom of the printed circuit board 120 due to the signal on the signal contact 124 being misdirected to the ground contact 138, forming a ground plane, on the bottom of the printed circuit board 120. The parasitic capacitance alters the impedance characteristic of the transmission line, formed by the edge connector 116. Techniques for reducing this parasitic capacitance include one or more of: 1) decreasing the area of the signal contact 124 and/or the ground contact 138, 2) increasing the distance between the signal contact 124 and the ground contact 138, and 3) decreasing the dielectric constant between the between the signal contact 124 and the ground contact 138. Preferably, the parasitic capacitance is reduced by a combination of decreasing the area of the signal contact 124 and by increasing the distance 39 between the signal contact 124 and the ground contact 138, as best shown in FIG. 30. Both of these techniques are implemented at the same time by removing some of receptacle 150 of the signal contact 124 near the spring member 125 on the bottom side closest to the ground contact 138. The removed portion of the receptacle 150 effectively forms a notch in the signal contact 124 near the spring member 125. Abutting the printed circuit board 120 against a front end (not numbered) of the left and right opposing sides of the housing 128 also serves to maintain a predetermined distance 39 between the signal contact 124 and the ground contact 138. Hence, the implementation of these two techniques on the third coaxial cable connector 112 by modifying or adjusting the third coaxial cable connector 112 alone advantageously reduces the parasitic capacitance, without modifying or adjusting the printed circuit board 120.

Alternatively, an analogous reduction of the parasitic capacitance may be achieved using the same combination of techniques by removing a portion of the ground contact 138, forming the ground plane, at the edge of the printed circuit board 120 closest to the signal contact 124. Still alternatively, an analogous reduction of the parasitic capacitance may be achieved using the same combination of techniques by removing some of the receptacle 150 of the signal contact 124 near the spring member 125 on the bottom side closest to the ground contact 138 and by removing a portion of the ground contact 138, forming the ground plane, at the edge of the printed circuit board 120 closest to the signal contact 124.

Note that a corresponding increase in the capacitance may be achieved, if desired, by performing one or more of: 1) increasing the area of the signal contact 124 and/or the ground contact 138, 2) decreasing the distance between the signal contact 124 and the ground contact 138, and 3) increasing the dielectric constant between the between the signal contact 124 and the ground contact 138. Hence, a combination of one or more of these three techniques advantageously permits the impedance characteristic of the transmission line, formed by the third coaxial cable connector 112, to be appropriately adjusted.

Further, when the third coaxial cable connector 112 is fitted to the edge of the printed circuit board 120, a high inductance may form between the third coaxial cable connector 112 and the printed circuit board 120 when the construction and impedance characteristics of the transmission line, formed in the third coaxial cable connector 112, do not extend far enough along the transmission line, formed as a micro-strip line, on the printed circuit board 120. Essentially, the transition from the transmission line structure of the third coaxial cable connector 112 and the transmission line structure of the printed circuit board 120 should not be abrupt and, therefore, should be gradual to permit the signal to transfer and translate from one structure to the other structure without significant loss or degradation. To facilitate a gradual transfer and translation of the signal from the transmission line structure of the third coaxial cable connector 112 and the transmission line structure of the printed circuit board 120, without significant loss or degradation, the third coaxial cable connector 112 is made to overhang or extend along the side of the printed circuit board 120 having the signal contact 136 that receives the signal contact 124 of the third coaxial cable connector 112. Each of the spring member 125 of the signal contact 124, the edge connector 116 and the insulator 132 of the third coaxial cable connector 112 extend across the printed circuit board 120, as best shown in FIG. 30. The distance of the extension is preferably calculated and/or empirically measured to ensure an appropriate gradual transfer and translation of the signal. Therefore, the extension of the third coaxial cable connector 112 along the side of the printed circuit board 120 advantageously provides a gradual transfer and translation of the signal to reduce the inductance, and thereby providing a proper impedance match between the third coaxial cable connector 112 and the printed circuit board 120.

Preferably, the insulator 132 is made from a suitable dielectric material, such as, without limitation, Teflon ®, and the like. The insulator 132 provides two primary functions. The first function of the insulator 132 is to hold the signal contact 124 in a fixed position that is substantially centered inside a cavity (not numbered) in the housing 128, as best shown in FIGS. 29 and 30. Preferably, the cavity is formed as a rectangular hole in the housing 128. As described above, the housing 128 is at the ground potential. Hence, the signal contact 124, having the signal potential, is substantially centered inside the housing 128, having the ground potential, similar to a transmission line formed of the coaxial cable 118. Hence, the housing 128 and/or the ground contact 30 provide a distributed ground potential around the signal contact 124. The second function of the insulator 132 is to provide a predetermined dielectric constant between the ground potential on the housing 128 and the signal potential on the signal contact 124. Each of these two primary functions advantageously mimic or approximate the unbalanced construction and impedance characteristics of a transmission line to provide an efficient coaxial-to-planar (or planar-to-coaxial) transition between the transmission line, formed by the coaxial cable 118, and the transmission line, formed by the micro-strip 136 on the printed circuit board 120.

The third coaxial cable connector 112 is assembled in the following sequential steps, after each of the required parts are formed or machined. First, the receptacle 150 of the signal contact 124 is mechanically and electrically coupled to the center conductor 140 of the coaxial cable 118. Second, the signal contact 124 is positioned in the insulator 132. Third, the insulator 132 is positioned in the housing 128, and, at the same time the housing 128 is disposed between the insulator 142 of the coaxial cable 118 and the ground conductor 144 of the coaxial cable 118. Fourth, a crimp sleeve or band 129 is placed over the ground conductor 144 of the coaxial cable 118 and crimped to cause a secure electrical and mechanical connection between the housing 128 and the ground conductor 144 of the coaxial cable 118. Fifth, the edge connector 116 is press fit into the hole 154 in the block 114, as described above.

The block 114 also includes one or more holes (not shown). The holes permits the block 114 to be mechanically secured to the header 122 mounted on the printed circuit board 120 or other structure to hold the third coaxial cable connector 112 on the edge of the printed circuit board 120 and to properly align the third coaxial cable connector 112 to the edge of the printed circuit board 120, using fasteners, such as, without limitation, screws, clips, and the like, as are well known in the art.

2. Edge Connector for the Third Coaxial Cable Connector

Figure 32:
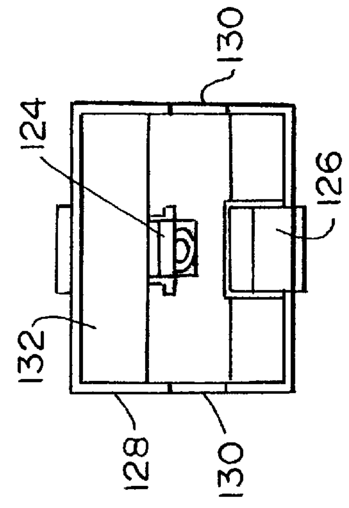
FIG. 32 illustrates a front side elevation view of the solder-less printed circuit board edge connector, as shown in FIG. 31, in accordance with the third preferred embodiment of the present invention.

FIGS. 31 and 32 illustrate two different views of the solder-less printed circuit board edge connector 116 for use with the third coaxial cable connector 112 of the third preferred embodiment and are described together. FIG. 31 illustrates a cross-sectional view of the solder-less printed circuit board edge connector 116 for use with the third coaxial cable connector 112, as shown in FIGS. 29 and 30, in accordance with the third preferred embodiment of the present invention. FIG. 32 illustrates a front side elevation view of the solder-less printed circuit board edge connector 116, as shown in FIG. 31, in accordance with the third preferred embodiment of the present invention.

Various features and advantages of the edge connector 116, including the housing 128, the signal contact 124, the insulator 132 and the ground contact 126, are described above with reference to FIGS. 29 and 30. The edge connector 116 is the same as that shown in FIGS. 29 and 30, but with the coaxial cable 118 removed there from. FIG. 31 also includes the crimp sleeve or band 129 formed as a separate part and not as an integral part of the housing 128.

3. Header and Block for the Third Coaxial Cable Connector

Figure 33:
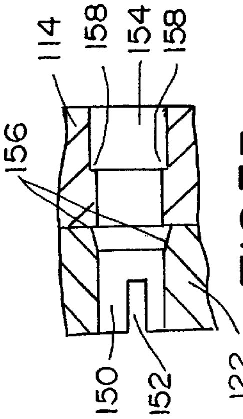
FIG. 33 illustrates a cross-sectional view of a header mated to a block for use with the third coaxial cable connector, as shown in FIGS. 29 and 30, in accordance with the third preferred embodiment of the present invention.

FIG. 33 illustrates a cross-sectional view of the header 122 mated to the block 114 for use with the third coaxial cable connector 112, as shown in FIGS. 29 and 30, in accordance with the third preferred embodiment of the present invention. The header 122 and the block 114 are the same as those shown in FIGS. 29 and 30, but with the edge connector 116 removed there from.

Various features and advantages of the block 114 and header 122, including the edges 156 and the stops 158 on the block 114, are described above with reference to FIGS. 29 and 30. The header 122 also includes a slot 152, best shown in FIG. 33, adapted to receive the printed circuit board 120. The header 122 further includes a hole 150, best shown in FIG. 33, adapted to receive the edge connector 116.

4. Summary of the Third Coaxial Cable Connector

FIGS. 28 through 33 illustrate the third coaxial cable connector 112 in accordance with the third preferred embodiment of the present invention. In the third preferred embodiment of the present invention, the third coaxial cable connector 112 includes a solder-less printed circuit board edge connector 116 for connecting multiple coaxial cables 118 to the edge of the printed circuit board 120. The coaxial cables 120 are adapted to be permanently connected to the third coaxial cable connector 112 by crimping the receptacle 150 of the signal contact 124 to the center signal conductor 140 of the coaxial cable 118 and by crimping the crimp sleeve 129 to the ground conductor 144 of the coaxial cable 118. The third coaxial cable connector 112 advantageously provides a coaxial-to-planar translation (or planar-to-coaxial translation) of the construction and impedance characteristics of a transmission line.

The third coaxial cable connector 112 has four of the five features described in the table above. The four features include: the third coaxial cable connector 112 having a common ground contact 126 for multiple coaxial cables 118 when the block 114 is conductive, modifications to the third coaxial cable connector 112 and/or the printed circuit board 120 for impedance matching, the signal contact 124 having a spring member 125 integrally formed with a receptacle 150 adapted to receive a center contact 140 of a coaxial cable 118, and a ground contact 126 integrally formed with the housing 128 of the third coaxial cable connector 112. Other features and advantages of the third coaxial cable connector 112 are described above with reference to FIGS. 28 through 33.

Therefore, the third coaxial cable connector 112 advantageously eliminates a conventional coaxial cable connector header that is typically soldered to a printed circuit board by providing a solder-less edge connector between the coaxial cable 118 and the micro-strip transmission line formed on the printed circuit board 120. The third coaxial cable connector 112 advantageously reduces connector cost, eliminates printed circuit board connector rework, eliminates connector parts on the printed circuit board, reduces labor for the assembly of the connector, reduces insertion forces, enhance mating alignment between the connector and the printed circuit board, and the like.

Hence, while the present invention has been described with reference to various illustrative embodiments thereof, the present invention is not intended that the invention be limited to these specific embodiments. Those skilled in the art will recognize that variations, modifications and combinations of the disclosed subject matter can be made without departing from the spirit and scope of the invention as set forth in the appended claims.

What is claimed is:

1. A solder-less printed circuit board edge connector comprising:

first, second and fourth through seventh transmission lines, each having respective signal and ground potentials;

a first edge connector adapted to provide the first transmission line, wherein the first edge connector is adapted to receive the fourth transmission line and adapted to receive the fifth transmission line, formed on a first printed circuit board, and wherein the first edge connector is adapted to electrically couple the fourth signal potential to the fifth signal potential via the first signal potential, and adapted to electrically couple the fourth ground potential to the fifth ground potential via the first ground potential;

a second edge connector adapted to provide the second transmission line, wherein the second edge connector is adapted to receive the sixth transmission line and adapted to-receive the seventh transmission line, formed on a second printed circuit board, and wherein the second edge connector is adapted to electrically couple the sixth signal potential to the seventh signal potential via the second signal potential, and adapted to electrically couple the sixth ground potential to the seventh ground potential via the second ground potential; and a first ground contact, formed as an independent part separate from each of the first edge connector, the second edge connector, the first printed circuit board and the second printed circuit board, adapted to be mechanically coupled to the first edge connector and the second edge connector and adapted to electrically couple the first ground potential to the second ground potential.

2. A solder-less printed circuit board edge connector according to claim 1 wherein the fourth transmission line and the sixth transmission line further comprise:

a first coaxial cable and a second coaxial cable, respectively.

3. A solder-less printed circuit board edge connector according to claim 2 wherein the first coaxial cable and the second coaxial cable are adapted to be electrically and mechanically coupled to and removed from the first edge connector and the second edge connector, respectively.

4. A solder-less printed circuit board edge connector according to claim 1 wherein the fifth transmission line and the seventh transmission line further comprise:

a first micro-strip transmission line and a second micro-strip transmission line, respectively.

5. A solder-less printed circuit board edge connector according to claim 1 wherein the first edge connector has a first slot formed therein and having the first ground potential, and wherein the second edge connector has a second slot formed therein and having the second ground potential, and wherein the first slot and the second slot are adapted to receive the first ground contact.

6. A solder-less printed circuit board edge connector according to claim 1 wherein the first ground contact has a "C-shaped" pattern.

7. A solder-less printed circuit board edge connector according to claim 1 wherein the first ground contact further comprises:

at least one spring member adapted to be electrically coupled to at least one of the fifth ground potential and the seventh ground potential.

8. A solder-less printed circuit board edge connector according to claim 7 wherein the at least one spring member is disposed at an end of the first ground contact.

9. A solder-less printed circuit board edge connector according to claim 7 wherein the at least one spring member is disposed between opposite ends of the first ground contact.

10. A solder-less printed circuit board edge connector according to claim 1 further comprising:

a third edge connector adapted to provide a third transmission line having a third signal potential and a third ground potential, wherein the third edge connector is adapted to receive an eighth transmission line having a eighth signal potential and a eighth ground potential, and adapted to receive a ninth transmission line, formed on a third printed circuit board, having a ninth signal potential and a ninth ground potential, and wherein the third edge connector is adapted to electrically couple the eighth signal potential to the ninth signal potential via the third signal potential, and adapted to electrically couple the eighth ground potential to the ninth ground potential via the third ground potential;

a second ground contact, formed as an independent part separate from each of the second edge connector, the third edge connector, the second printed circuit board and the third printed circuit board, adapted to be mechanically coupled to the second edge connector and the third edge connector and adapted to electrically couple the second ground potential to third ground potential; and a first extension member adapted to electrically and mechanically couple the first ground contact to the second ground contact.

11. A solder-less printed circuit board edge connector according to claim 10 wherein the first extension member has a notch formed therein to permit the first extension member to bypass a second signal contact carrying the second signal potential for the second edge connector.

12. A solder-less printed circuit board edge connector according to claim 10 wherein the first extension member is integrally formed as a unitary unit with the first ground contact and the second ground contact.

13. A solder-less printed circuit board edge connector comprising:

first, second and fourth through seventh transmission lines, each having respective signal and ground potentials;

a first edge connector adapted to provide a first transmission line having, wherein the first edge connector is adapted to receive the fourth transmission line, formed as a first coaxial cable, and adapted to receive the fifth transmission line, formed on a first printed circuit board, wherein the first edge connector is adapted to electrically couple the fourth signal potential to the fifth signal potential via the first signal potential, and adapted to electrically couple the fourth ground potential to the fifth ground potential via the first ground potential, and wherein the first edge connector has a first slot formed therein and having the first ground potential;

a second edge connector adapted to provide the second transmission line, wherein the second edge connector is adapted to receive the sixth transmission line, formed as a second coaxial cable, and adapted to receive the seventh transmission line, formed on a second printed circuit board, wherein the second edge connector is adapted to electrically couple the sixth signal potential to the seventh signal potential via the second signal potential, and adapted to electrically couple the sixth ground potential to the seventh ground potential via the second ground potential, and wherein the second edge connector has a second slot formed therein and having the second ground potential; and a first ground contact, formed as an independent part separate from each of the first edge connector, the second edge connector, the first printed circuit board and the second printed circuit board, adapted to be mechanically coupled to the first slot and the second slot and adapted to electrically couple the first ground potential to the second ground potential, wherein the first ground contact further comprises:

at least one spring member adapted to be electrically coupled to at least one of the fifth ground potential and the seventh ground potentials.

14. A solder-less printed circuit board edge connector according to claim 13 wherein the first coaxial cable and the second coaxial cable are adapted to be electrically and mechanically coupled to and removed from the first edge connector and the second edge connector, respectively.

15. A solder-less printed circuit board edge connector according to claim 13 wherein the first ground contact has a "C-shaped" pattern.

16. A solder-less printed circuit board edge connector according to claim 13 wherein the at least one spring member is disposed at a side of the first ground contact.

17. A solder-less printed circuit board edge connector according to claim 13 further comprising:

a third edge connector adapted to provide a third transmission line having a third signal potential and a third ground potential, wherein the third edge connector is adapted to receive an eighth transmission line, formed as a third coaxial cable, having a eighth signal potential and a eighth ground potential, and adapted to receive a ninth transmission line, formed on a third printed circuit board, having a ninth signal potential and a ninth ground potential, wherein the third edge connector is adapted to electrically couple the eighth signal potential to the ninth signal potential via the third signal potential, and adapted to electrically couple the eighth ground potential to the ninth ground potential via the third ground potential, and wherein the third edge connector has a third slot formed therein and having the third ground potential;

a second ground contact, formed as an independent part separate from each of the second edge connector, the third edge connector, the second printed circuit board and the third printed circuit board, adapted to be mechanically coupled to the second slot and the third slot and adapted to electrically couple the second ground potential to third ground potential, wherein the second ground contact further comprises:

at least one spring member adapted to be electrically coupled to at least one of the seventh ground potential and the ninth ground potential; and a first extension member adapted to electrically and mechanically couple the first ground contact to the second ground contact.

18. A solder-less printed circuit board edge connector according to claim 17 wherein the first extension member has a notch formed therein to permit the first extension member to bypass a second signal contact carrying the second signal potential for the second edge connector.

19. A solder-less printed circuit board edge connector according to claim 17 wherein the first extension member is integrally formed as a unitary unit with the first ground contact and the second ground contact.

20. An electronic assembly comprising:

first, second and fourth to seventh transmission lines each having respective signal and ground potentials, the fifth transmission line, formed on a first printed circuit board;

the seventh transmission line, formed on a second printed circuit board; and a solder-less printed circuit board edge connector including:

a first edge connector adapted to provide the first transmission line, wherein the first edge connector is adapted to electrically couple the fourth signal potential to the fifth signal potential via the first signal potential, and adapted to electrically couple the fourth ground potential to the fifth ground potential via the first ground potential;

a second edge connector adapted to provide the second transmission line, wherein the second edge connector is adapted to electrically couple the sixth signal potential to the seventh signal potential via the second signal potential, and adapted to electrically couple the sixth ground potential to the seventh ground potential via the second ground potential; and a first ground contact, formed as an independent part separate from each of the first edge connector, the second edge connector, the first printed circuit board and the second printed circuit board, adapted to be mechanically coupled to the first edge connector and the second edge connector and adapted to electrically couple the first ground potential to the second ground potential.

* * * * *